(12) United States Patent
Jin et al.

(10) Patent No.: US 11,290,673 B2
(45) Date of Patent: Mar. 29, 2022

(54) SENSOR OPERATING BASED ON MEASURING RANGE OF DEPTH AND SENSING SYSTEM INCLUDING THE SAME

(71) Applicant: Samsung Electronics Co., Ltd., Suwon-si (KR)

(72) Inventors: Younggu Jin, Suwon-si (KR); Youngchan Kim, Seongnam-si (KR); Moosup Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 16/876,567

(22) Filed: May 18, 2020

(65) Prior Publication Data

US 2021/0144325 A1 May 13, 2021

(30) Foreign Application Priority Data

Nov. 7, 2019 (KR) .................. 10-2019-0141421

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14609* (2013.01); *H01L 27/14643* (2013.01); *H04N 5/372* (2013.01); *H04N 5/37452* (2013.01)

(58) Field of Classification Search
CPC .... H04N 5/378; H04N 5/37452; H04N 5/372; H04N 5/3745; H04N 5/36965;
(Continued)

(56) References Cited

U.S. PATENT DOCUMENTS

| 8,537,218 B2 | 9/2013 | Kawahito |
| 9,313,372 B2 | 4/2016 | Oh et al. |
| 9,392,231 B2 | 7/2016 | Kanamori et al. |
| 9,699,442 B2 | 7/2017 | Fereyre et al. |

(Continued)

FOREIGN PATENT DOCUMENTS

KR 101922046 B1 11/2018

OTHER PUBLICATIONS

Sanggwon Lee et al., "A Back-Illuminated Time-of-Flight Image Sensor with SOI-Based Fully Depleted Detector Technology for LiDAR Application", Proceedings 2018, 2, 798; doi:10.3390/proceedings2130798.

(Continued)

*Primary Examiner* — Albert H Cutler
(74) *Attorney, Agent, or Firm* — Harness, Dickey & Pierce, P.L.C.

(57) ABSTRACT

According to at least some example embodiments of the inventive concepts, a sensor includes a pixel array including a pixel configured to generate a first pixel signal and a second pixel signal, based on a light sensed during a window time of a sensing time; processing circuitry configured to select a measuring range from among a plurality of measuring ranges and set a width of the window time based on the selected measuring range; a converting circuit configured to convert the first and second pixel signals into digital signals; and a driving circuit configured to generate an overflow control signal, a first photo gate signal, and a second photo gate signal so as to sense the light during the window time, wherein the pixel includes, a photoelectric conversion element, first and second readout circuits configured to receive charges, and an overflow transistor configured to remove charges.

23 Claims, 24 Drawing Sheets

(51) Int. Cl.
*H04N 5/372* (2011.01)
*H04N 5/3745* (2011.01)
*H04N 5/369* (2011.01)

(58) Field of Classification Search
CPC .............. H04N 5/369; H01L 27/14643; H01L 27/14609; H01L 27/14641
See application file for complete search history.

(56) References Cited

U.S. PATENT DOCUMENTS

| | | |
|---|---|---|
| 9,903,941 B2 | 2/2018 | Jeong et al. |
| 2017/0064235 A1* | 3/2017 | Wang ...................... G01S 17/10 |
| 2018/0156898 A1* | 6/2018 | Suzuki .................. G01S 7/4865 |
| 2018/0156899 A1 | 6/2018 | Yamada et al. |
| 2019/0174123 A1 | 6/2019 | Munro |
| 2020/0029047 A1 | 1/2020 | Jin et al. |
| 2020/0264308 A1* | 8/2020 | Brady ............... H01L 27/14643 |
| 2021/0132198 A1* | 5/2021 | Tang ....................... G01S 17/89 |

OTHER PUBLICATIONS

Tomonari Sawada et al., "TOF Range Image Sensor Using a Range-Shift Technique", 1-4244-2581-5/08/$20.00 © 2008 IEEE.
Kenneth R. Spring et al., "Concepts in Digital Imaging Technology Proximity-Focused Image Intensifiers", hamamatsu.magnet.fsu.edu/articles/proximity.html retrieved Mar. 3, 2020.
"The Image Intensifier-Lambert Instruments", lambertinstruments.com/technologies-1/2014/12/4/the-imageintensifier.
Hamamatsu Photonics K.K., "Image Intensifier", TII 0007E01 Mar. 2016 IP(1500).

* cited by examiner

SENSOR OPERATING BASED ON MEASURING RANGE OF DEPTH AND SENSING SYSTEM INCLUDING THE SAME

CROSS-REFERENCE TO RELATED APPLICATIONS

This application claims priority under 35 U.S.C. § 119 to Korean Patent Application No. 10-2019-0141421 filed on Nov. 7, 2019, in the Korean Intellectual Property Office, the disclosures of which are incorporated by reference herein in their entireties.

BACKGROUND

At least some example embodiments of the inventive concepts are described herein relate to a light sensor and a system including the light sensor, and more particularly, relate to a sensor operating based on a measuring range of a depth and a sensing system including the same.

A light sensor may be applied to various electronic devices including a smartphone. The light sensor may be used to convert an external light into an electrical signal and to capture an external image. Nowadays, the light sensor may be implemented to perform various functions of calculating a distance (or a depth) of an object and recognizing the object by using a sensed image, as well as a function of capturing an external image targeted for a display.

A time of flight (ToF) based sensing system may be implemented to calculate a distance between the sensing system and the object by using a sensor. The sensing system may include a light source. A light output from the light source may be reflected by the object, the reflected light may be provided to the image sensor, and a depth of the object may be calculated by using the reflected light. In particular, there is a demand on a sensing system improving the accuracy of measurement of an object by sensing only an object within a particular measuring range.

SUMMARY

At least some example embodiments of the inventive concepts provide a sensor operating based on a measuring range of a depth so as to measure a depth of an object within a particular range and a sensing system including the same.

According to at least some example embodiments of the inventive concepts, a sensor includes a pixel array including a pixel configured to generate a first pixel signal and a second pixel signal, based on a light sensed during a window time of a sensing time; processing circuitry configured to select a measuring range from among a plurality of measuring ranges and set a width of the window time based on the selected measuring range; a converting circuit configured to convert the first and second pixel signals into digital signals; and a driving circuit configured to generate an overflow control signal, a first photo gate signal, and a second photo gate signal so as to sense the light during the window time, wherein the pixel includes, a photoelectric conversion element configured to generate charges based on the sensed light, a first readout circuit configured to receive first charges generated during a first time of the window time based on the first photo gate signal and to generate the first pixel signal based on the first charges, a second readout circuit configured to receive second charges generated during a second time of the window time based on the second photo gate signal and to generate the second pixel signal based on the second charges, and an overflow transistor configured to remove third charges generated during a delay time of the sensing time from the photoelectric conversion element, based on the overflow control signal, and wherein the delay time is before the window time in the sensing time.

According to at least some example embodiments of the inventive concepts, a sensor includes a pixel array including a pixel configured to generate an analog signal including a plurality of pixel signals based on a light sensed during a sensing time; a converting circuit configured to convert the analog signal into a digital signal; and a driving circuit configured to generate a first photo gate signal, a second photo gate signal, a third photo gate signal, and a fourth photo gate signal based on a measuring range of a depth, wherein the pixel includes a photoelectric conversion element configured to generate charges based on the sensed light; a first readout circuit configured to receive first charges generated during a first time of the sensing time based on the first photo gate signal and to generate a first pixel signal based on the first charges; a second readout circuit configured to receive second charges generated during a second time of the sensing time based on the second photo gate signal and to generate a second pixel signal based on the second charges; a third readout circuit configured to receive third charges generated during a third time of the sensing time based on the third photo gate signal and to generate a third pixel signal based on the third charges; and a fourth readout circuit configured to remove fourth charges generated during a fourth time, which is before the first to third times, of the sensing time from the photoelectric conversion element, based on the fourth photo gate signal.

According to at least some example embodiments, a sensing system includes a light source configured to output light pulses; a sensor configured to sense reflected pulses of the light pulses during a sensing time and to generate a depth image; and processing circuitry configured to control the light source and the sensor based on an operation mode which depends on a measuring range of a depth, wherein the sensor includes a pixel array including a pixel configured to generate pixel signals based on the reflected pulses, and a converting circuit configured to generate the depth image based on the pixel signals, and wherein the pixel includes: a photoelectric conversion element configured to generate charges based on the reflected pulses, readout circuits configured to generate the pixel signals based on first charges generated during a window time of the sensing time, and an overflow transistor configured to remove second charges generated during a delay time of the sensing time and to remove third charges generated during a masking time of the sensing time from the photoelectric conversion element, and wherein the delay time is before the window time within the sensing time and the masking time is after the window time within the sensing time.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
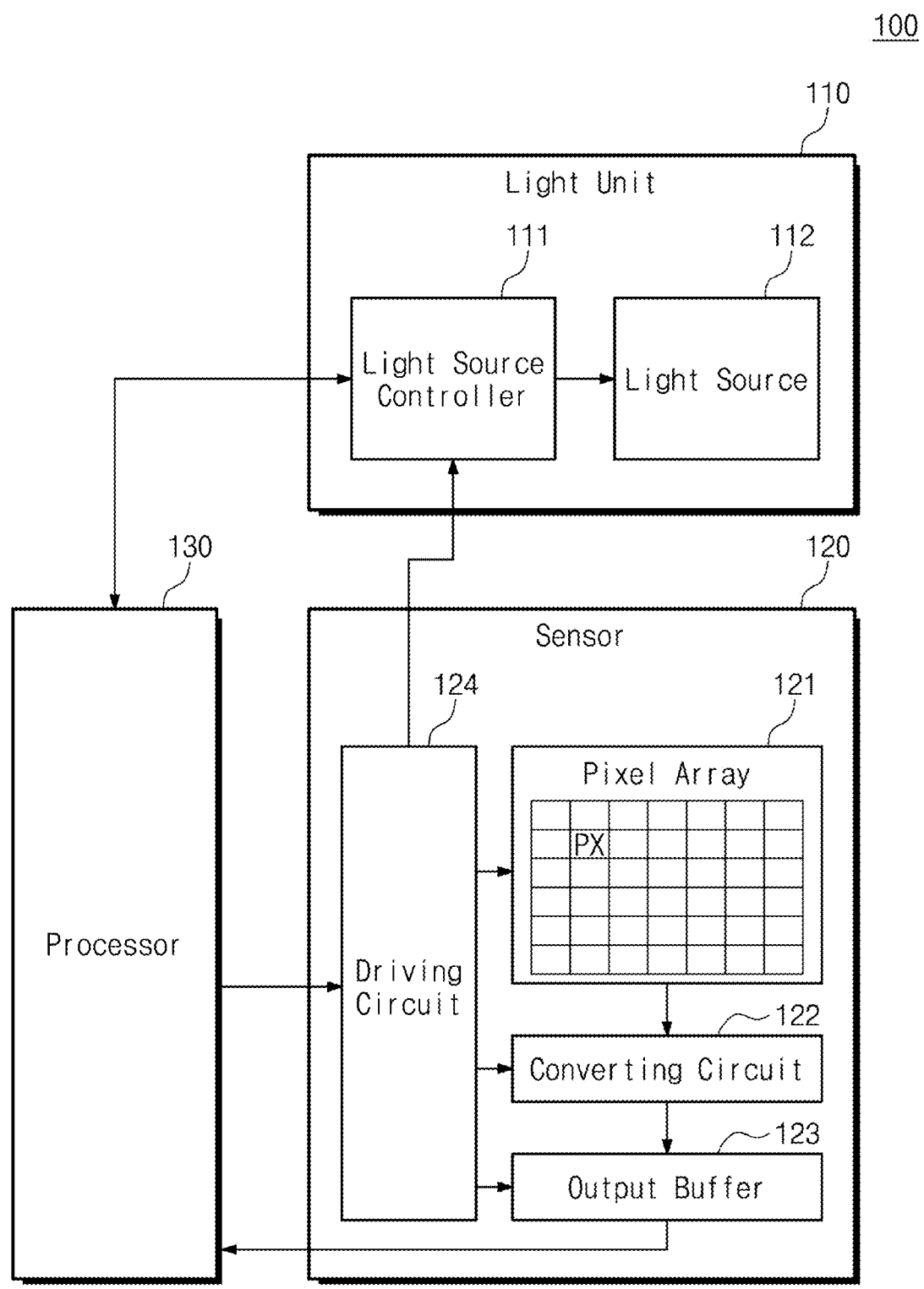
FIG. 1 is a block diagram of a sensing system according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a sensing system according to at least one example embodiment of the inventive concepts. Referring to FIG. 1, a sensing system 100 includes a light unit 110, a sensor 120, and a processor 130. The sensing system 100 may be implemented with various electronic devices such as a digital camera, a smartphone, a tablet PC, and a wearable device. Also, the sensing system 100 may be implemented with various systems for peripheral recognition such as an autonomous driving system. For example, the sensing system 100 may be implemented with an integrated circuit (IC) or a system on chip (SoC). However, at least some example embodiments of the inventive concepts are not limited thereto. For example, the sensing system 100 may be implemented with any device or circuit for measuring a depth of an object.

The light unit 110 is configured to output a light to the outside. For example, the light unit 110 may output a light in a band (e.g., an infrared band) not perceived by a user to the outside. However, at least one example embodiment of the inventive concepts is not limited thereto. For example, the light unit 110 may output, to the outside, the light in any other band as well as the infrared band. The light unit 110 may include a light source controller 111 and a light source 112.

The light source controller 111 may control an operation of the light source 112. The light source controller 111 may control a timing of the light that is output from the light source 112. The light source controller 111 may control the light source 112 so as to output a light having a regular cycle. To this end, a control signal may be generated from the sensor 120 (e.g., a driving circuit 124) or the processor 130. The light source controller 111 may modulate the light output from the light source 112. For example, the modulated light may have the shape of a square wave (light pulse) or the shape of a sine wave.

The light source 112 may output a light to the outside under control of the light source controller 111. The light source 112 may include a light-emitting device that generates a light based on the electrical signal received from the light source controller 111. For example, the light source 112 may output light pulses in the infrared band. The light output from the light source 112 may arrive at an object.

The sensor 120 senses the light reflected from the object. The sensor 120 may generate a depth image being an electrical signal, based on the reflected light. The depth image may be used to measure a depth from the sensing system 100 to the object. The sensor 120 may include a pixel array 121, a converting circuit 122, an output buffer 123, and the driving circuit 124.

The pixel array 121 may convert the light sensed from the outside into an analog signal being an electrical signal. The light sensed from the outside includes a light that is reflected by the object after being output from the light source 112. The pixel array 121 includes a plurality of pixels PX arranged two-dimensionally. Each of the plurality of pixels PX may generate an analog signal based on the light received from the outside. The analog signal may include a pixel signal corresponding to each pixel PX. The pixel array 121 may be controlled by driving signals (or control signals) that are provided from the driving circuit 124, which will be described with reference to FIG. 2.

The pixels PX may sense the light from the outside during a sensing time and may respectively generate pixel signals. Due to a distance between the sensing system 100 and an object, the reflected light incident onto each pixel PX may be in time delayed with respect to the light output from the light source 112. As such, a time difference may be present between the light output from the light source 112 and the reflected light incident onto each pixel PX. The distance between the object and the sensing system 100 may be calculated by using the time difference. How the pixels PX generate pixel signals will be described with reference to FIG. 2.

The converting circuit 122 may convert an analog signal output from the pixel array 121 to a digital signal. This digital signal may be referred as to as a "depth image". The converting circuit 122 may perform various operations for converting an analog signal into a digital signal, based on the control signals provided from the driving circuit 124. For example, the converting circuit 122 may perform a correlated double sampling (CDS) operation on the analog signal and may remove a noise included in the analog signal.

The output buffer 123 may store the digital signal or the depth image generated from the converting circuit 122. The output buffer 123 may output the digital signal or the depth image to the processor 130.

The driving circuit 124 may control the pixel array 121, the converting circuit 122, and the output buffer 123. For example, the driving circuit 124 may generate a clock signal and a timing control signal for operations of the pixel array 121, the converting circuit 122, and the output buffer 123. The clock signal and the timing control signal may be provided to the light source controller 111.

For example, to generate a depth image corresponding to one frame, the driving circuit 124 may control a global reset operation and a charge integration operation that are performed on all the pixels PX of the pixel array 121. Afterwards, under control of the driving circuit 124, pixel signals generated from the pixels PX through the charge integration operation may be output to the converting circuit 122 in units of a row.

The processor 130 may control the sensing system 100 and may calculate various data. The processor 130 may control the light source 112 such that the light source 112 outputs a light. According to at least some example embodiments of the inventive concepts, the processor 130 may control the sensor 120. For example, the processor 130 may allow the sensor 120 to sense the light reflected from an object and to generate a depth image. For example, the processor 130 may control the elements of the sensor 120 (e.g., the pixel array 121, the converting circuit 122, and the output buffer 123) by controlling the driving circuit 124 to output desired control signals to the elements of the sensor 120. According to at least some example embodiments of the inventive concepts, the processor 130 may be or include processing circuitry such as hardware including logic circuits; a hardware/software combination executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. According to at least some example embodiments of the inventive concepts, the processing circuitry may include a hardware-implemented data processing device having circuitry that is physically structured to execute desired operations including, for example, operations represented as code and/or instructions included in a program. According to at least some example embodiments of the inventive concepts, any or all operations discussed in the present disclosure as being performed by a light unit, a sensor, a sensing system, or an element thereof may be controlled and/or performed by a processor (e.g., processor 130 and/or 230) executing code (e.g., program code) that is stored in memory and includes instructions configured to cause the processor to perform and/or control to the operations.

The processor 130 may include an image signal processor (ISP) (not illustrated) for processing the depth image received from the output buffer 123. The image signal processor (not illustrated) may calculate a distance between the object and the sensing system 100, that is, a time of flight (ToF) value, based on the depth image. For example, the processor 130 may calculate a delay time, by which the reflected light is delayed with respect to the output light, based on the depth image and may calculate the ToF value based on the delay time. The processor 130 may determine a distance, a shape, and a movement speed of the object by using the ToF value.

The processor 130 may decide a measuring range of a depth that the sensor 120 is capable of measuring. The processor 130 may select one of operation modes corresponding to different measuring ranges. For example, the operation modes may include a first mode for measuring a depth of an object within a first range relatively close to the sensing system 100, and a second mode for measuring a depth of an object within a second range relatively distant from the sensing system 100. Depending on the selected operation mode, the processor 130 may allow the driving circuit 124 to adjust a time to receive charges generated by a light, which the pixels PX sense, and a time to remove the charges. This will be more fully detailed later.

Figure 2:
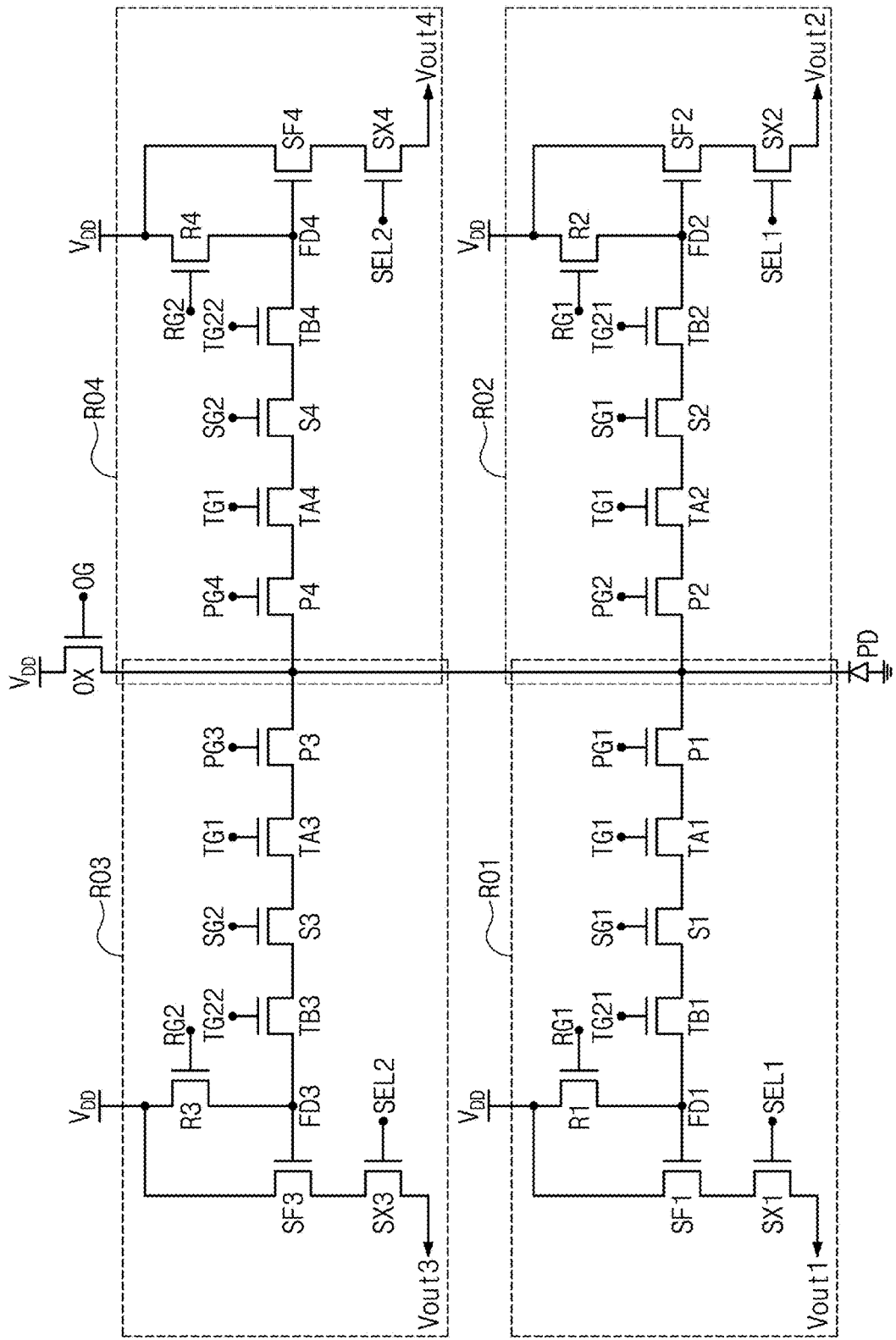
FIG. 2 is an example circuit diagram of a pixel of FIG. 1.

FIG. 2 is an example circuit diagram of a pixel of FIG. 1. Referring to FIG. 2, a pixel PXa may include a photoelectric conversion element PD, a first readout circuit RO1, a second readout circuit RO2, a third readout circuit RO3, a fourth readout circuit RO4, and an overflow transistor OX.

The photoelectric conversion element PD may generate charges based on a light sensed from the outside. The charges generated by the photoelectric conversion element PD may be distributed into the first to fourth readout circuits RO1 to RO4. The first to fourth readout circuits RO1 to RO4 may share one photoelectric conversion element PD. That is, the photoelectric conversion element PD may be electrically connected with the first to fourth readout circuits RO1 to RO4. For example, the photoelectric conversion element PD may include a photo diode for converting a light signal into an electrical signal.

The first to fourth readout circuits RO1 to RO4 may include photo transistors P1, P2, P3, and P4, first transfer transistors TA1, TA2, TA3, and TA4, storage transistors S1, S2, S3, and S4, second transfer transistors TB1, TB2, TB3, and TB4, reset transistors R1, R2, R3, and R4, source follower transistors SF1, SF2, SF3, and SF4, and selection transistors SX1, SX2, SX3, and SX4.

For convenience of description, in embodiments below, the description will be given under the assumption that transistors included in a pixel are turned on when a voltage of a high level is applied to a control terminal (or a gate terminal), like an NMOS transistor. However, at least some example embodiments of the inventive concepts are not limited thereto. For example, each of the transistors included in the pixel PXa may be turned on when a voltage of a low level is applied to a control terminal (or a gate terminal), like a PMOS transistor. That is, a kind of transistors included in the pixel PXa and a pixel to be described below are not limited to FIG. 2.

The photo transistors (or first to fourth photo transistors) P1 to P4 may receive charges generated from the photoelectric conversion element PD based on first, second, third, and fourth photo gate signals PG1, PG2, PG3, and PG4, respectively. The first to fourth photo gate signals PG1 to PG4 may have different phases within a sensing time. As such, the first to fourth photo transistors P1 to P4 may be turned on during different times within the sensing time and may receive the generated charges during the different times. The first to fourth photo gate signals PG1 to PG4 may be provided from the driving circuit 124. The amounts of charges that the first to fourth photo transistors P1 to P4 receive may be different. A time delay of a light output from the light source 112 of FIG. 1 may be calculated based on the different charge amounts.

The first transfer transistors TA1 to TA4 may be turned on during the sensing time based on a first transfer control signal TG1 and may be turned off during a time other than the sensing time. The first transfer control signal TG1 may be provided from the driving circuit 124. The first transfer transistors TA1 to TA4 may transfer charges received from the photo transistors P1 to P4 to the storage transistors S1 to S4 during the sensing time. The first transfer transistors TA1 to TA4 may prevent charges generated from the photoelectric conversion element PD from being transferred to the storage transistors S1 to S4 during a time other than the sensing time.

The storage transistors S1 to S4 may store the charges received by the photo transistors P1 to P4. The storage transistors S1 to S4 may be turned on during the sensing time based on storage control signals SG1 and SG2 and may receive the charges transferred through the first transfer transistors TA1 to TA4. The storage transistors S1 to S4 may be turned off during a readout time for outputting pixel signals Vout1, Vout2, Vout3, and Vout4 after the sensing time based on the storage control signals SG1 and SG2 and may output the stored charges to floating diffusion areas FD1, FD2, FD3, and FD4. The storage control signals SG1 and SG2 may be provided from the driving circuit 124.

The second transfer transistors TB1 to TB4 may be turned off during the sensing time based on second transfer control signals TG21 and TG22 and may be turned on during the readout time. For example, the readout time of the first and second readout circuits RO1 and RO2 and the readout time of the third and fourth readout circuits RO3 and RO4 are different, but at least some example embodiments of the inventive concepts are not limited thereto. The second transfer control signals TG21 and TG22 may be provided from the driving circuit 124. The second transfer transistors TB1 to TB4 may be turned off during the sensing time and may prevent the charges stored at the storage transistors S1 to S4 from being transferred to the floating diffusion areas FD1 to FD4. The second transfer transistors TB1 to TB4 may be turned on during the readout time and may transfer the charges stored at the storage transistors S1 to S4 to the floating diffusion areas FD1 to FD4.

The reset transistors R1 to R4 may remove the charges stored at the floating diffusion areas FD1 to FD4 based on reset control signals RG1 and RG2. The reset transistors R1 to R4 may be connected between a supply terminal of a power supply voltage $V_{DD}$ and the floating diffusion areas FD1 to FD4. The reset control signals RG1 and RG2 may be provided from the driving circuit 124.

The source follower transistors SF1 to SF4 generate the pixel signals Vout1, Vout2, Vout3, and Vout4 based on the charges stored at the floating diffusion areas FD1 to FD4. Magnitudes of the pixel signals Vout1 to Vout4 are decided depending on the amounts of charges stored at the floating diffusion areas FD1 to FD4.

The selection transistors SX1 to SX4 output the pixel signals Vout1 to Vout4 to the converting circuit 122 of FIG. 1 based on selection signals SEL1 and SEL2. The pixel signals Vout1 to Vout4 may be output to a column line connected with the selection transistors SX1 to SX4. The selection signals SEL1 and SEL2 may be provided from the driving circuit 124.

The overflow transistor OX may be turned off based on an overflow control signal OG while at least one of the photo transistors P1 to P4 is turned on and may be turned on based on the overflow control signal OG while all the photo transistors P1 to P4 are turned off or are turned on. While the first transfer control signal TG1 is turned off and the overflow control signal OG is turned on, all the photo transistors P1 to P4 may be simultaneously turned off or may maintain a turn-on state. The overflow control signal OG may be provided from the driving circuit 124. The overflow transistor OX may be connected between the supply terminal of the power supply voltage $V_{DD}$ and the readout circuits RO1 to RO4 (or the photoelectric conversion element PD). When turned on, the overflow transistor OX may remove charges generated from the photoelectric conversion element PD.

Unlike the example of FIG. 2 in which the overflow transistor OX is directly connected with the photoelectric conversion element PD, the overflow transistor OX may be connected with the photoelectric conversion element PD through the photo transistors P1 to P4. In this case, the photo transistors P1 to P4 may be turned on during a time other than the sensing time. In contrast, in the structure where the overflow transistor OX is directly connected with the photoelectric conversion element PD, the photo transistors P1 to P4 may be turned off during a time other than the sensing time.

The overflow transistor OX may remove charges generated from the photoelectric conversion element PD due to an external light during a time other than the sensing time. In addition, the overflow transistor OX may be turned on during a portion of the sensing time, thus removing charges generated by a light reflected from an object existing within an unwanted distance. That is, the overflow transistor OX may operate in such a way that an object existing within a range other than a measuring range corresponding to an operation mode selected by the processor 130 of FIG. 1 is prevented from being detected.

Figure 3:
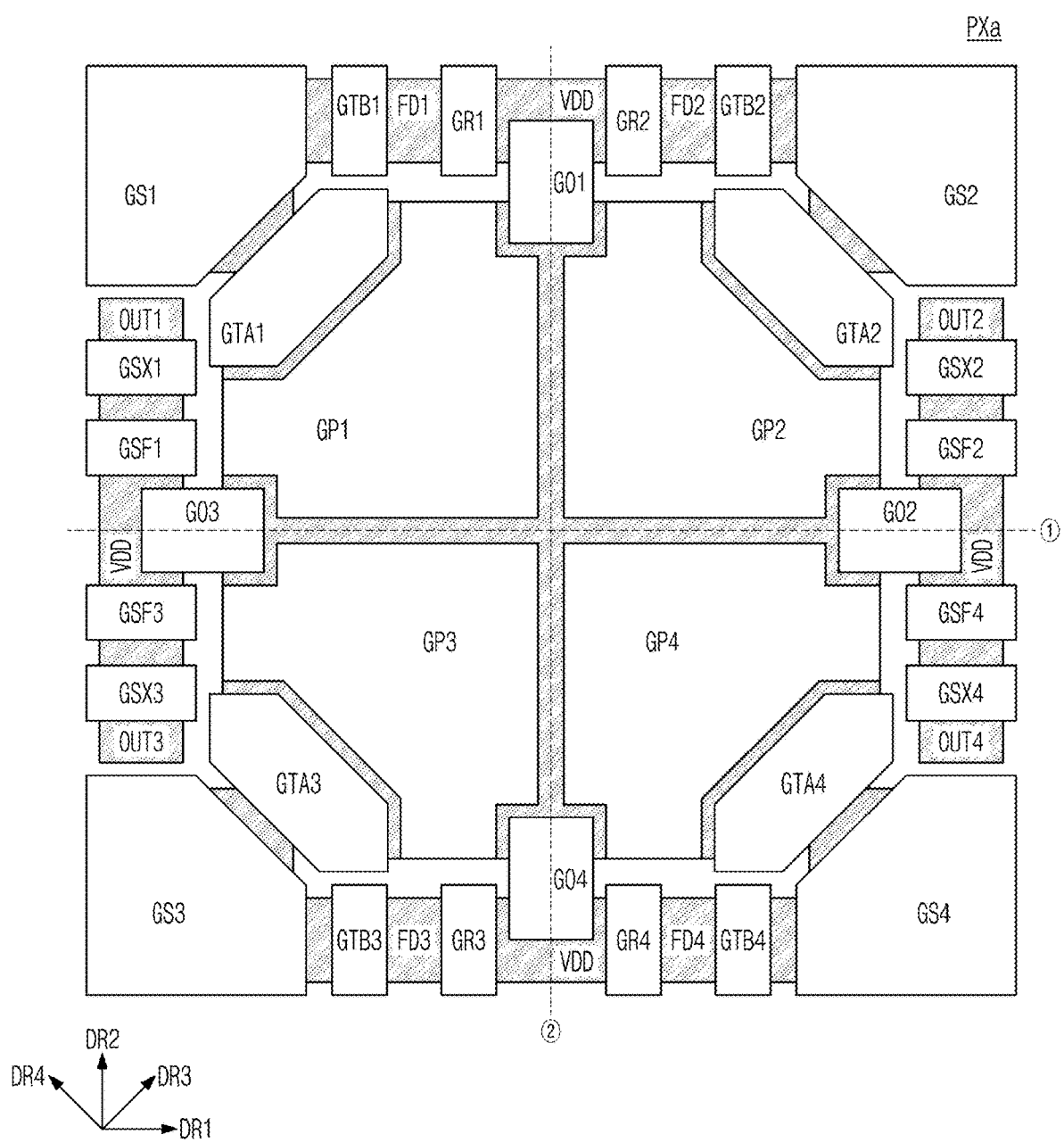
FIG. 3 is an example layout of a pixel of FIG. 2.

FIG. 3 is an example layout of a pixel of FIG. 2. Referring to FIG. 3, the pixel PXa may include gate electrodes GP1, GP2, GP3, and GP4 of the photo transistors P1, P2, P3, and P4, gate electrodes GTA1, GTA2, GTA3, and GTA4 of the transfer transistors TA1, TA2, TA3, and TA4, gate electrodes GS1, GS2, GS3, and GS4 of the storage transistors S1, S2, S3, and S4, gate electrodes GTB1, GTB2, GTB3, and GTB4 of the second transfer transistors TB1, TB2, TB3, and TB4, gate electrodes GR1, GR2, GR3, and GR4 of the reset transistors R1, R2, R3, and R4, gate electrodes GSF1, GSF2, GSF3, and GSF4 of the source follower transistors SF1, SF2, SF3, and SF4, gate electrodes GSX1, GSX2, GSX3, and GSX4 of the selection transistors SX1, SX2, SX3, and SX4, and gate electrodes GO1, GO2, GO3, and GO4 of the overflow transistor OX. Drains or sources of various transistors described with reference to FIG. 2 and the floating diffusion areas FD1 to FD4 may be formed or disposed in shaded areas of FIG. 3.

First, second, third, and fourth directions DR1, DR2, DR3, and DR4 are defined in FIG. 3. The first direction DR1 and the second direction DR2 may be perpendicular to each other. Each of the first and second directions DR1 and DR2 may be perpendicular to a direction that faces the pixel array 121 in a plan view. For example, the first and second directions DR1 and DR2 may correspond to the row and column directions in which the pixels PXa of the pixel array 121 are arranged. The third direction DR3 may indicate a direction between the directions DR1 and DR2, and the fourth direction DR4 may be perpendicular to the third direction DR3. Each of the third and fourth directions DR3 and DR4 may be perpendicular to a direction that faces the pixel array 121 in a plan view.

The gate electrodes GP1 to GP4 of the photo transistors P1 to P4 may be disposed adjacent to each other in the central region of the pixel PXa. The gate electrodes GTA1 to GTA4 of the first transfer transistors TA1 to TA4 may be disposed adjacent to the respective gate electrodes GP1 to GP4 along the third direction DR3 or the fourth direction DR4. The gate electrodes GS1 to GS4 of the storage transistors S1 to S4 may be disposed adjacent to the respective gate electrodes GTA1 to GTA4 along the third direction DR3 or the fourth direction DR4. The gate electrodes GTB1 to GTB4 of the second transfer transistors TB1 to TB4 may be respectively interposed between the gate electrodes GS1 to GS4 and the floating diffusion areas FD1 to FD4 along the first direction DR1. The gate electrodes GR1 to GR4 of the reset transistors R1 to R4 may be disposed adjacent to the respective floating diffusion areas FD1 to FD4 along the first direction DR1.

The gate electrodes GSF1 to GSF4 of the source follower transistors SF1 to SF4 may be disposed adjacent to the respective gate electrodes GP1 to GP4 along the first direction DR1. Although not illustrated in FIG. 3, metal wires electrically connecting the floating diffusion areas FD1 to FD4 with the gate electrodes GSF1 to GSF4 may be disposed on/above the pixel PXa. The gate electrodes GSX1 to GSX4 of the selection transistors SX1 to SX4 may be disposed adjacent to the respective gate electrodes GSF1 to GSF4 along the second direction DR2.

An imaginary line ① may be parallel to the first direction DR1, and an imaginary line ② may be parallel to the second direction DR2. A cross point of the imaginary lines ① and ② may be the center of the pixel PXa in a plan view. The area of the pixel PXa may be divided into quadrants, each of which is bounded by the imaginary lines ① and ②. The readout circuits RO1 to RO4 (refer to FIG. 2) of the pixel PXa may be respectively disposed in the quadrants. For example, the first and second readout circuits RO1 and RO2 may be symmetrical with respect to the imaginary line ②. The third and fourth readout circuits RO3 and RO4 may be symmetrical with respect to the imaginary line ②. The first and third readout circuits RO1 and RO3 may be symmetrical with respect to the imaginary line ①. The second and fourth readout circuits RO2 and RO4 may be symmetrical with respect to the imaginary line ①. The first and fourth readout circuits RO1 and RO4 may be symmetrical with respect to the center of the pixel PXa. The second and third readout circuits RO2 and RO3 may be symmetrical with respect to the center of the pixel PXa. As a result, the first to fourth readout circuits RO1 to RO4 may share one photoelectric conversion element PD.

Figure 4:
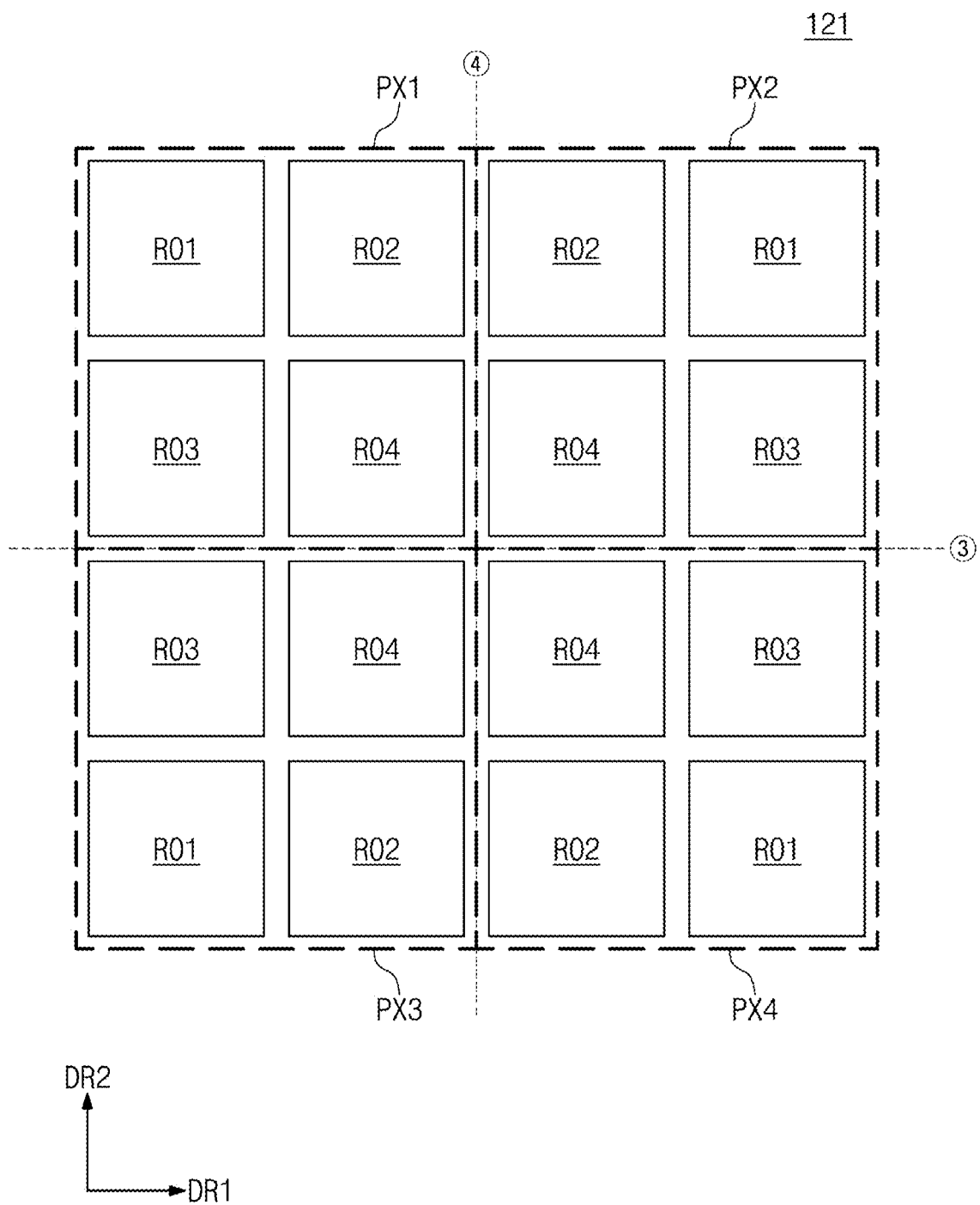
FIG. 4 is a diagram illustrating an example structure in which readout circuits of FIG. 2 are disposed.

FIG. 4 is a diagram illustrating an example structure in which readout circuits of FIG. 2 are disposed. The first to fourth pixels PX1, PX2, PX3, and PX4 of the pixel array 121 are illustrated in FIG. 4. The first pixel PX1 and the second pixel PX2 may be disposed adjacent to each other in the first direction DR1. The third pixel PX3 and the fourth pixel PX4 may be disposed adjacent to each other in the first direction DR1. The first pixel PX1 and the third pixel PX3 may be disposed adjacent to each other in the second direction DR2. The second pixel PX2 and the fourth pixel PX4 may be disposed adjacent to each other in the second direction DR2.

Each of the first to fourth pixels PX1 to PX4 may include the first to fourth readout circuits RO1 to RO4. As described with reference to FIG. 2, the first to fourth readout circuits RO1 to RO4 may share the photoelectric conversion element PD and the overflow transistor OX and may include various transistors described with reference to FIG. 2.

As described with reference to FIGS. 2 and 3, the first to fourth readout circuits RO1 to RO4 may be symmetrical with respect to the center of each of the first to fourth pixels PX1 to PX4 and may have the same circuit structure. The first to fourth readout circuits RO1 to RO4 may operate based on photo gate signals having different phases, respectively. That is, the first to fourth readout circuits RO1 to RO4 may be divided based on a timing to receive charges generated from the photoelectric conversion element PD.

An imaginary line ① may be parallel to the first direction DR1, and an imaginary line ④ may be parallel to the second direction DR2. In a plan view, a cross point of the imaginary lines ① and ④ may be the center of the first to fourth pixels PX1 to PX4. The first to fourth pixels PX1 to PX4 may be divided into quadrants on the basis of the imaginary lines ① and ④. The first to fourth pixels PX1 to PX4 may be disposed in the quadrants, respectively. For example, the first and second pixels PX1 and PX2 may be symmetrical with respect to the imaginary line ④. The third and fourth pixels PX3 and PX4 may be symmetrical with respect to the imaginary line ④. The first and third pixels PX1 and PX3 may be symmetrical with respect to the imaginary line ③. The second and fourth pixels PX2 and PX4 may be symmetrical with respect to the imaginary line ③. The first and fourth pixels PX1 and PX4 may be symmetrical with respect to the center. The second and third pixels PX2 and PX3 may be symmetrical with respect to the center.

As a result, the fourth readout circuits RO4 of the first to fourth pixels PX1 to PX4 may be disposed adjacent to each other with respect to the center. Besides, in the pixel array 121, four identical read circuits may be adjacent to each other with respect to the center of four adjacent pixels. In this case, the four identical readout circuits may share a floating diffusion area. That is, four readout circuits operating in response to photo gate signals of the same phase may be gathered such that a floating diffusion area is shared, and thus, the size of the pixel array 121 may decrease. However, it may be understood that the structure of the first to fourth pixels PX1 to PX4 of FIG. 4 is an example, and the first to fourth pixels PX1 to PX4 may include the first to fourth readout circuits RO1 to RO4 having the same layout.

Figure 5:
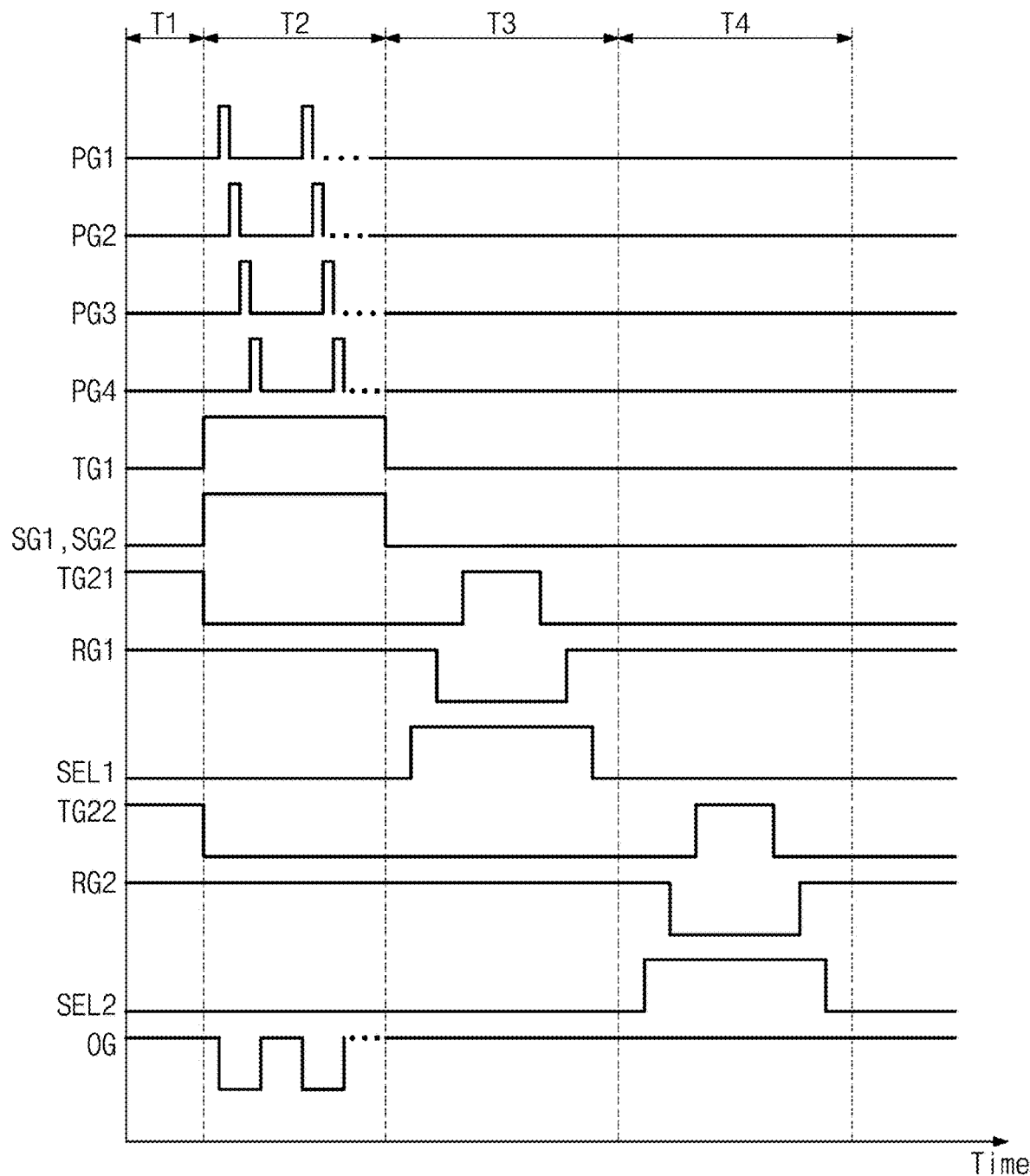
FIGS. 5 and 6 are example timing diagrams of a pixel of FIG. 2.

FIG. 5 is a timing diagram of a pixel of FIG. 2. In FIG. 5, a horizontal axis represents a time, and a vertical axis represents magnitudes of the first to fourth photo gate signals PG1 to PG4, the first transfer control signal TG1, the storage control signals SG1 and SG2, the second transfer control signals TG21 and TG22, the reset control signals RG1 and RG2, the selection signals SEL1 and SEL2, and the overflow control signal OG. The above signals may be generated from the driving circuit 124 of FIG. 1. In an embodiment, it is assumed that transistors to which the signals illustrated in FIG. 5 are applied are turned on when the signals have a high level. For convenience of description, FIG. 5 will be described with reference to reference signs of FIGS. 1 and 2.

A first time T1 is defined as the global reset time. During the global reset time, charges generated or stored at the pixel array 121 including the floating diffusion areas FD1 to FD4, the storage transistors S1 to S4, and the photoelectric conversion element PD may be removed. To this end, the reset control signals RG1 and RG2, the second transfer control signals TG21 and TG22, and the overflow control signal OG may have a high level.

A second time T2 is defined as the sensing time. During the sensing time, the light source 112 of FIG. 1 outputs light pulses to the outside, and the pixel array 121 senses pulses reflected from an object and generates charges. The first to fourth photo gate signals PG1 to PG4 may have different phases at a given frequency. Each of the first to fourth photo gate signals PG1 to PG4 may have the high level during a different time. That is, the first to fourth photo transistors P1 to P4 may receive the charges generated based on the received light during the different times.

The first to fourth photo gate signals PG1 to PG4 may have the high level after a given delay time. The delay time may be decided depending on a measuring range of a depth selected by the processor 130. The delay time may have a small time interval in an operation mode for sensing an object existing at a close distance from the sensing system 100 and may have a great time interval in an operation mode for sensing an object existing at a long distance from the sensing system 100.

During the second time T2, charges received from the first to fourth photo transistors P1 to P4 are stored at the storage transistors S1 to S4 through the first transfer transistors TA1 to TA4. To this end, the first transfer control signal TG1 and the storage control signals SG1 and SG2 may have the high level.

The overflow control signal OG may have a low level while at least one of the first to fourth photo gate signals PG1 to PG4 has the high level and may have the high level while all the first to fourth photo gate signals PG1 to PG4 have the low level (or the high level). When the overflow control signal OG has the high level, the overflow transistor OX removes charges generated by the photoelectric conversion element PD.

The overflow control signal OG may control the overflow transistor OX so as not to sense an object being out of the measuring range of the depth decided by the processor 130. The overflow control signal OG may have the high level during a delay time of the second time T2 such that an object of a close distance being out of the measuring range is not sensed. The overflow control signal OG may have the high level after a time, during which the first to fourth photo gate signals PG1 to PG4 have the high level, of the second time T2, and thus, an object of a long distance being out of the measuring range may not be sensed.

A third time T3 may be defined as a first readout time for reading pixel signals from readout circuits (e.g., the first and second readout circuits RO1 and RO2 of FIG. 2) corresponding to a first row. A fourth time T4 may be defined as a second readout time for reading pixel signals from readout circuits (e.g., the third and fourth readout circuits RO3 and RO4 of FIG. 2) corresponding to a second row. During the third and fourth times T3 and T4, to block the introduction of additional charges due to an external light or a dark current, the first to fourth photo gate signals PG1 to PG4, the first transfer control signal TG1, and the storage control signals SG1 and SG2 may have the low level, and the overflow control signal OG may have the high level.

When the first transfer control signal TG21 corresponding to the first row have the high level during the third time T3, the charges stored at the first and second storage transistors S1 and S2 are transferred to the first and second floating diffusion areas FD1 and FD2. In this case, the first reset control signal RG1 corresponding to the first row may have the low level. Pixel signals generated based on the charges stored at the first and second floating diffusion areas FD1 and FD2 may be output to the converting circuit 122 based on the first selection signal SEL1

When the second transfer control signal TG22 corresponding to the second row have the high level during the fourth time T4, the charges stored at the third and fourth storage transistors S3 and S4 are transferred to the third and fourth floating diffusion areas FD3 and FD4. In this case, the second reset control signal RG2 corresponding to the second row may have the low level. Pixel signals generated based on the charges stored at the third and fourth floating diffusion areas FD3 and FD4 may be output to the converting circuit 122 based on the second selection signal SEL2.

Unlike the example illustrated in FIG. 5, the second transfer control signals TG21 and TG22 may have the same waveform, the reset control signals RG1 and RG2 may have the same waveform, and the selection signals SEL1 and SEL2 may have the same waveform. In this case, the first to fourth readout circuits RO1 to RO4 may output pixel signals at the same time.

Figure 6:
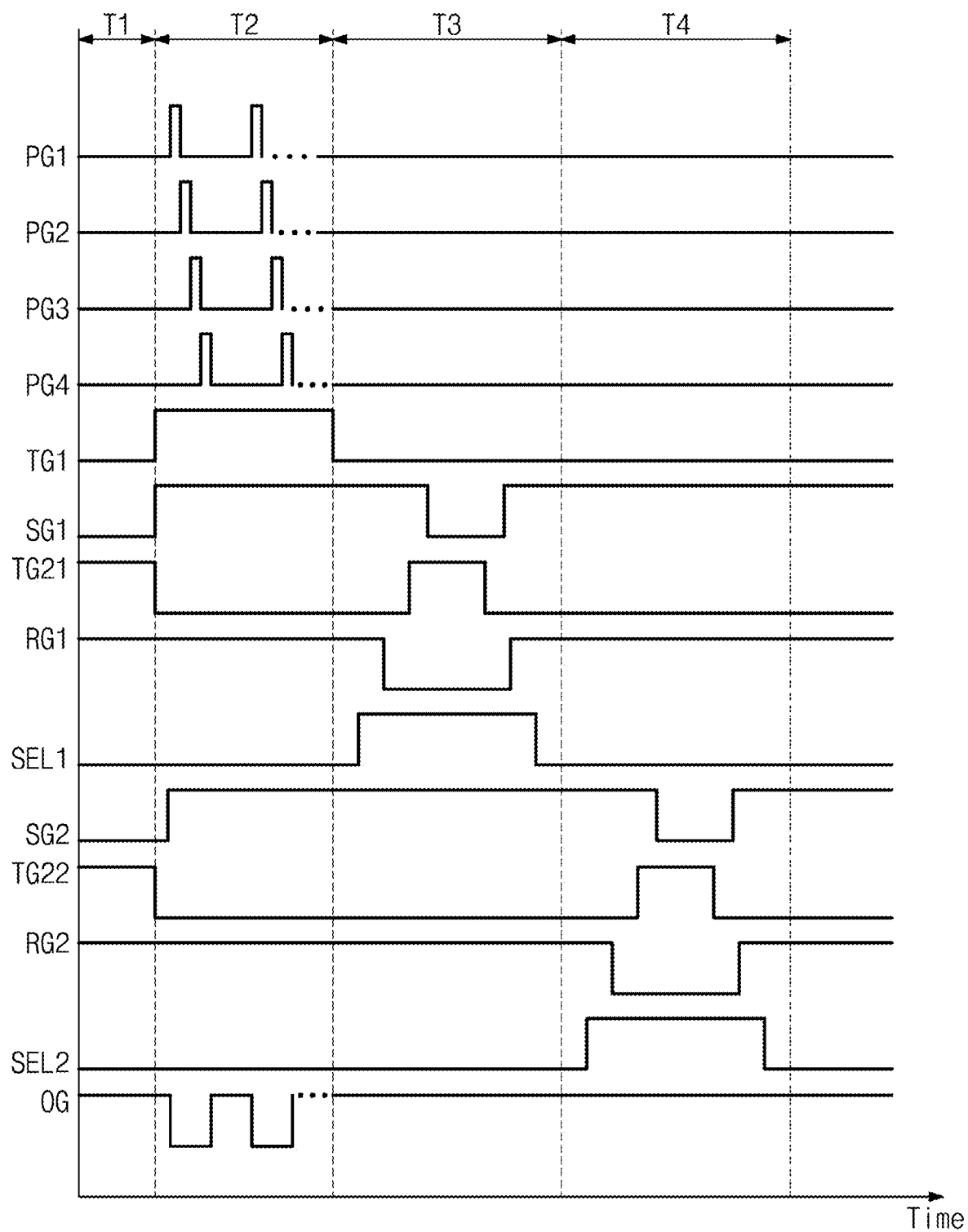

FIG. 6 is an example timing diagram of a pixel of FIG. 2. The timing diagram of FIG. 6 is identical to the timing diagram of FIG. 5 except for waveforms of the storage control signals SG1 and SG2, and thus, additional description associated with the same signals of FIG. 5 will be omitted to avoid redundancy.

Referring to FIG. 6, unlike FIG. 5, the storage control signals SG1 and SG2 may have the low level when the second transfer control signals TG21 and TG22 have the high level during the third time T3 or the fourth time T4. That is, the storage transistors S1 to S4 may maintain a storage capacity of charges before the stored charges are transferred to the floating diffusion areas FD1 to FD4 through the second transfer transistors TB1 to TB4. In an actual operation, a reaction time difference between the storage transistors S1 to S4 and the second transfer transistors TB1 to TB4 may exist, or a time taken to transfer charges may exist. As such, the second transfer control signals TG21 and TG22 may be quickly changed compared with the storage control signals SG1 and SG2. In the case where an external light is strong, charges, the amount of which exceeds the storage capacity of the floating diffusion areas FD1 to FD4, may be generated. To prevent the overflow of the floating diffusion areas FD1 to FD4, the storage transistors S1 to S4 may be turned on during partial times of the third and fourth times T3 and T4.

Figure 7:
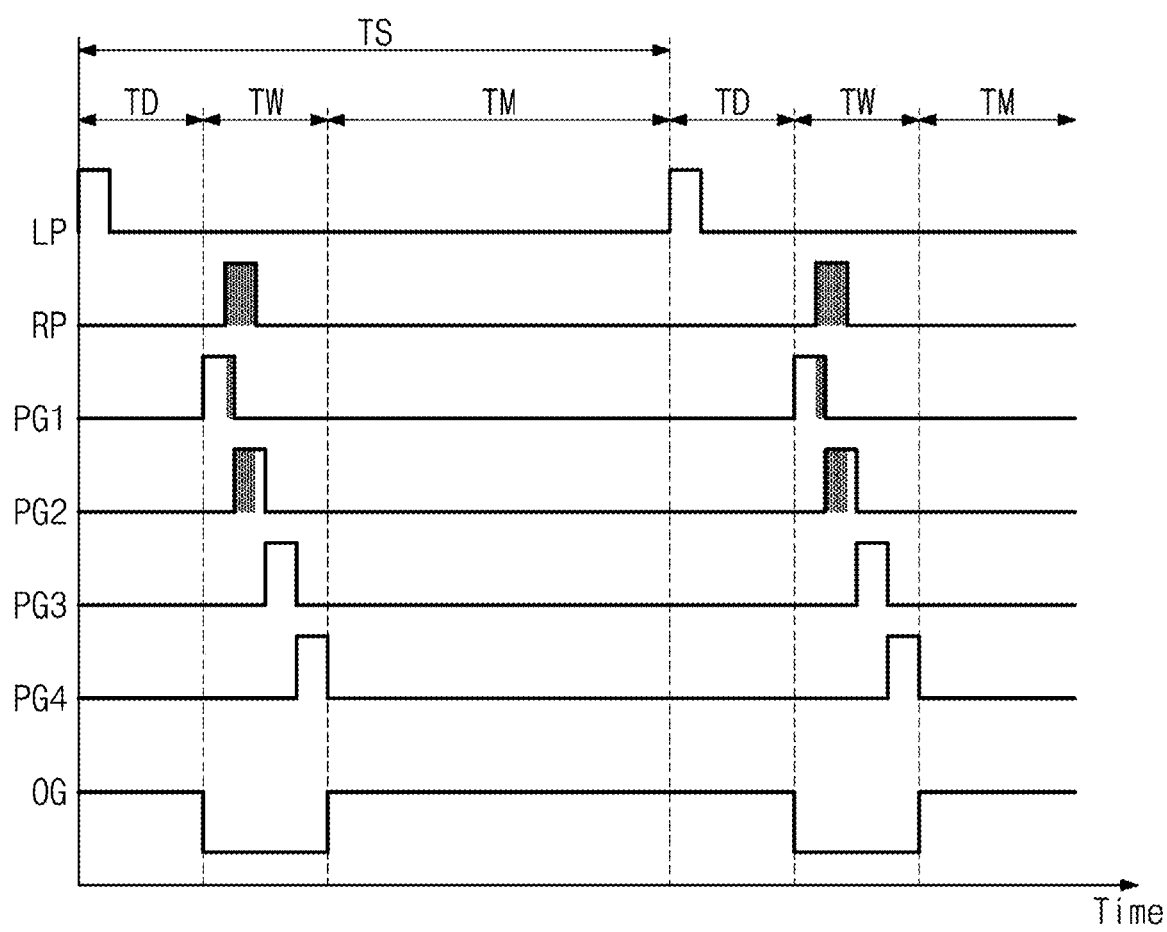
FIGS. 7 and 8 are timing diagrams of a sensing time of FIG. 5 or 6.
Figure 8:
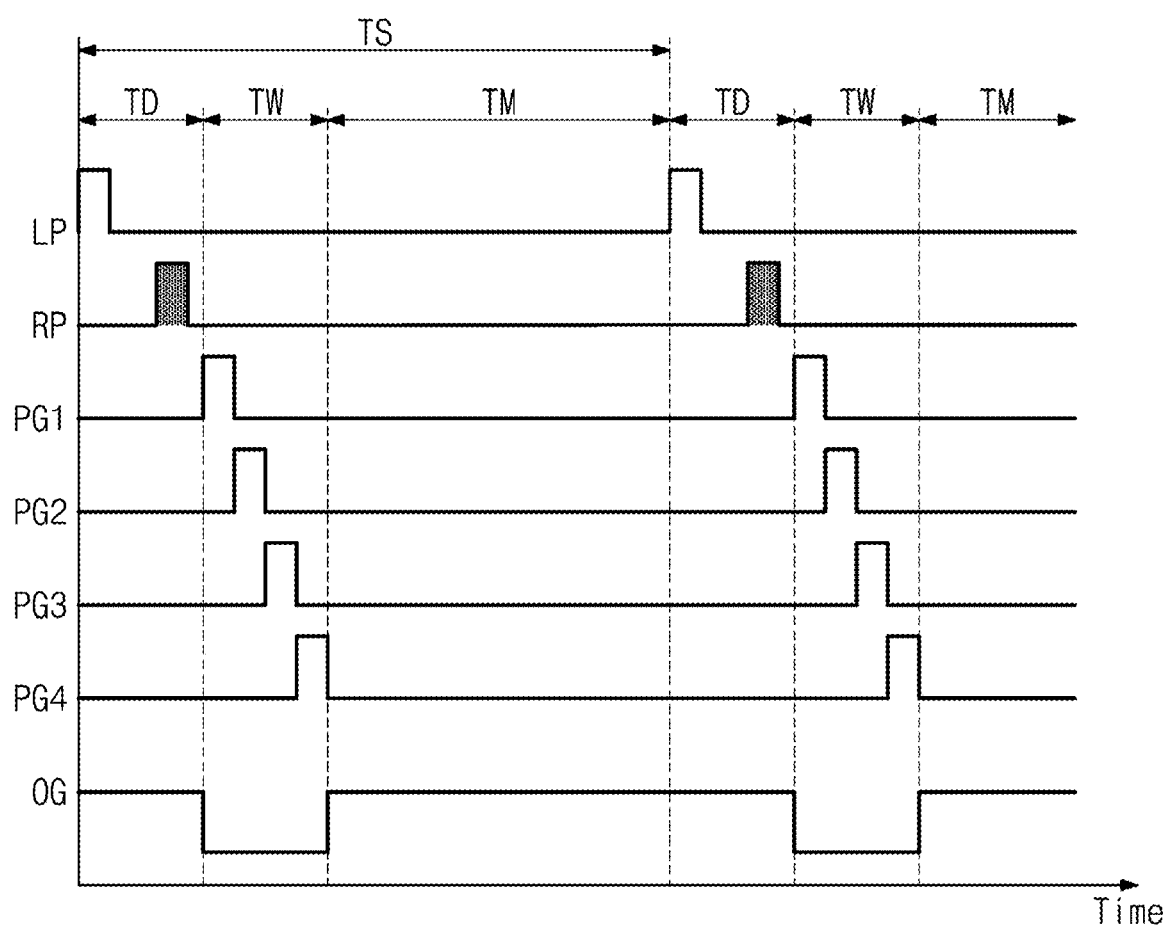

FIGS. 7 and 8 are example timing diagrams of a sensing time of FIG. 5 or 6. In FIGS. 7 and 8, a horizontal axis represents a time, and a vertical axis represents magnitudes of a light pulse signal LP, a reflection pulse signal RP, the first to fourth photo gate signals PG1 to PG4, and the overflow control signal OG.

The light pulse signal LP is output from the light source 112 of FIG. 1. The light pulse signal LP may include pulses having a period of a reference time TS. The reflection pulse signal RP may include pulses arriving at the pixel array 121 after the light pulse signal LP is reflected from an object. One reference time TS may include a delay time TD, a window time TW, and a masking time TM.

During the delay time TD, the pulse of the light pulse signal LP is output from the light source 112. A length or width of the delay time TD may depend on a measuring range of a depth selected by the processor 130 of FIG. 1. For example, the delay time TD may have a small width in an operation mode for sensing an object existing at a close distance from the sensing system 100 and may have a great width in an operation mode for sensing an object existing at a long distance from the sensing system 100. The delay time TD may be adjusted depending on the operation mode.

During the delay time TD, the overflow control signal OG may have the high level. As a result, charges generated by the photoelectric conversion element PD during the delay time TD may be removed. A light provided to the pixel array 121 during the delay time TD may not be sensed. This light may be an external light or the reflection pulse signal RP provided from an object closer to the sensing system 100 than a measuring range of a depth.

During the window time TW, the reflection pulse signal RP input to the pixel array 121 may be sensed. A length or width of the window time TW may depend on the measuring range of the depth selected by the processor 130 of FIG. 1. For example, the window time TW may have a great width in an operation mode for sensing an object within a wide range and may have a small width in an operation mode for sensing an object within a narrow range. The window time TW may be adjusted depending on the operation mode.

During the window time TW, the overflow control signal OG may have the low level. As a result, charges generated from the photoelectric conversion element PD during the window time TW may be distributed to the readout circuits RO1 to RO4 based on the first to fourth photo gate signals PG1 to PG4 and may be stored at the readout circuits RO1 to RO4. The first to fourth photo gate signals PG1 to PG4 may have different phases and may have the high level at different times. An example is illustrated as the times when the first to fourth photo gate signals PG1 to PG4 have the high level do not overlap each other, but at least some example embodiments of the inventive concepts are not limited thereto. For example, some of the times when the first to fourth photo gate signals PG1 to PG4 have the high level may overlap each other.

Because the width of the window time TW is adjusted depending on the operation mode, a pulse width of the first to fourth photo gate signals PG1 to PG4 may be adjusted to correspond to the width of the window time TW. For example, as the window time TW increases, the pulse width of the first to fourth photo gate signals PG1 to PG4 may also increase. The driving circuit 124 may adjust the pulse width of the photo gate signals PG1 to PG4 based on the operation mode selected by the processor 130.

Because the width of the window time TW is adjusted depending on the operation mode, the pulse width of the light pulse signal LP may be adjusted to correspond to the width of the window time TW. For example, as the window time TW increases, the pulse width of the light pulse signal LP may also increase. The light source controller 111 may adjust the pulse width of the light source controller 111 based on the operation mode selected by the processor 130.

During the masking time TM, the overflow control signal OG may have the high level. As a result, charges generated by the photoelectric conversion element PD during the masking time TM may be removed. A light provided to the pixel array 121 during the masking time TM may not be sensed. This light may be an external light or the reflection pulse signal RP provided from an object more distant from the sensing system 100 than the measuring range of the depth. A length or width of the masking time TM may depend on the measuring range of the depth selected by the processor 130 of FIG. 1. For example, the width of the masking time TM may be decided depending on the widths of the delay time TD and the window time TW.

An end time point of the delay time TD or a start time point of the window time TW may correspond to the lower limit of the measuring range of the depth. An end time point of the window time TW or a start time point of the masking time TM may correspond to the upper limit of the measuring range of the depth. The delay time TD, the window time TW, and the masking time TM may be repeated. As the delay time TD, the window time TW, and the masking time TM are repeated, charges stored at the readout circuits RO1 to RO4 may be accumulated, and a measurement error of a depth may decrease.

Referring to FIG. 7, the reflection pulse signal RP includes a pulse that is provided to the pixel array 121 during the window time TW. That is, an object may exist within a measuring range corresponding to an operation mode. For example, a part of charges generated by the reflection pulse signal RP may be stored at the first readout circuit RO1 based on the first photo gate signal PG1, and the rest of the charges may be stored at the second readout circuit RO2 based on the second photo gate signal PG2. A magnitude of the pixel signal may be decided depending on the amount of stored charges. A depth of an object may be calculated based on magnitudes of pixel signals respectively output from the readout circuits RO1 to RO4.

Referring to FIG. 8, the reflection pulse signal RP includes a pulse that is provided to the pixel array 121 during a time (e.g., the delay time TD) other than the window time TW. That is, an object may be out of a measuring range corresponding to an operation mode. Accordingly, charges generated by the reflection pulse signal RP may be removed by the overflow transistor OX. For example, dust closer to the sensing system 100 than the measuring range or unnecessary objects more distant from the sensing system 100 than the measuring range may not be sensed by the sensing system 100. As a result, an object of a targeted measuring range may be exactly sensed.

Figure 9:
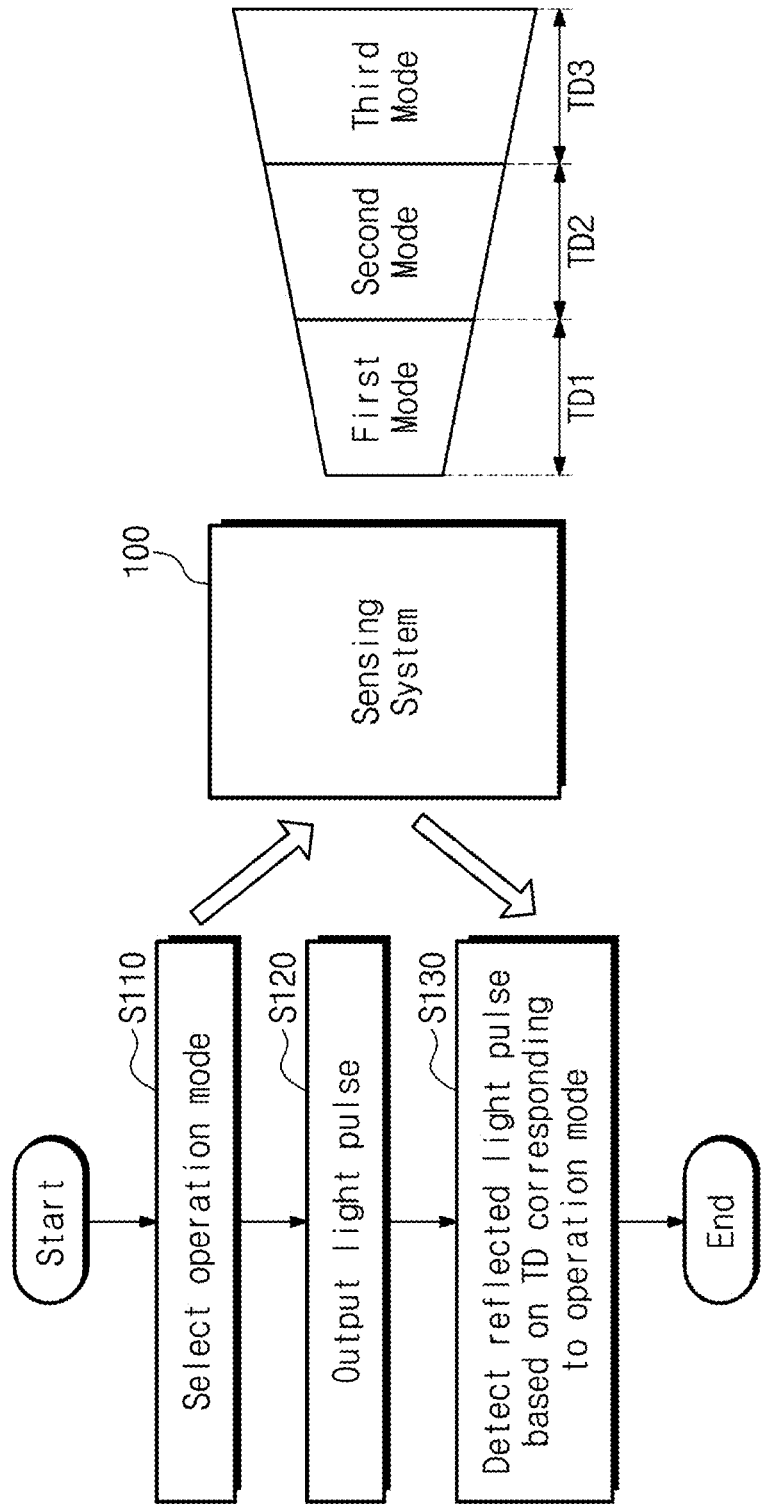
FIGS. 9 to 12 are example flowcharts of an operation method of a sensing system of FIG. 1.

FIG. 9 is an example flowchart of an operation method of a sensing system of FIG. 1. An embodiment corresponding to the case where measuring ranges of a depth corresponding to operation modes are different but widths of the measuring ranges are identical will be described with reference to operations of FIG. 9. For convenience of description, FIG. 9 will be described with reference to signs of FIGS. 1 and 2.

In operation S110, the processor 130 may select an operation mode of the sensing system 100. In an embodiment, the operation mode may include a first mode, a second mode, and a third mode. The first mode may be an operation mode for sensing an object within a first range from the sensing system 100. The second mode may be an operation mode for sensing an object within a second range that is more distant from the sensing system 100 than the first range. The third mode may be an operation mode for sensing an object within a third range that is more distant from the sensing system 100 than the second range. The first to third ranges may have the same width and may be, for example, 30 m wide. The processor 130 may select one of the first to third operation modes depending on a sensing purpose.

In operation S120, the light unit 110 may output light pulses to the outside. The output light pulses may be reflected from an object and may arrive at the sensing system 100.

In operation S130, the sensor 120 may detect or sense the reflected light pulses. The driving circuit 124 may generate an overflow control signal and photo gate signals so as to have the delay time TD corresponding to the operation mode selected in operation S110. The delay time TD may include first, second, and third delay times TD1, TD2, and TD3 respectively corresponding to the first, second, and third modes. The first delay time TD1 may be smaller than the second delay time TD2, and the second delay time TD2 may be smaller than the third delay time TD3.

A start time point of the window time TW described with reference to FIGS. 7 and 8 may be decided based on the first to third delay times TD1 to TD3. The sensing system 100 measures a depth of an object based on reflection pulses received from the window time TW. A measuring range of an object may be selected by selecting one of different delay times. The sensing system 100 may calculate a depth of an object existing within the selected measuring range.

Figure 10:
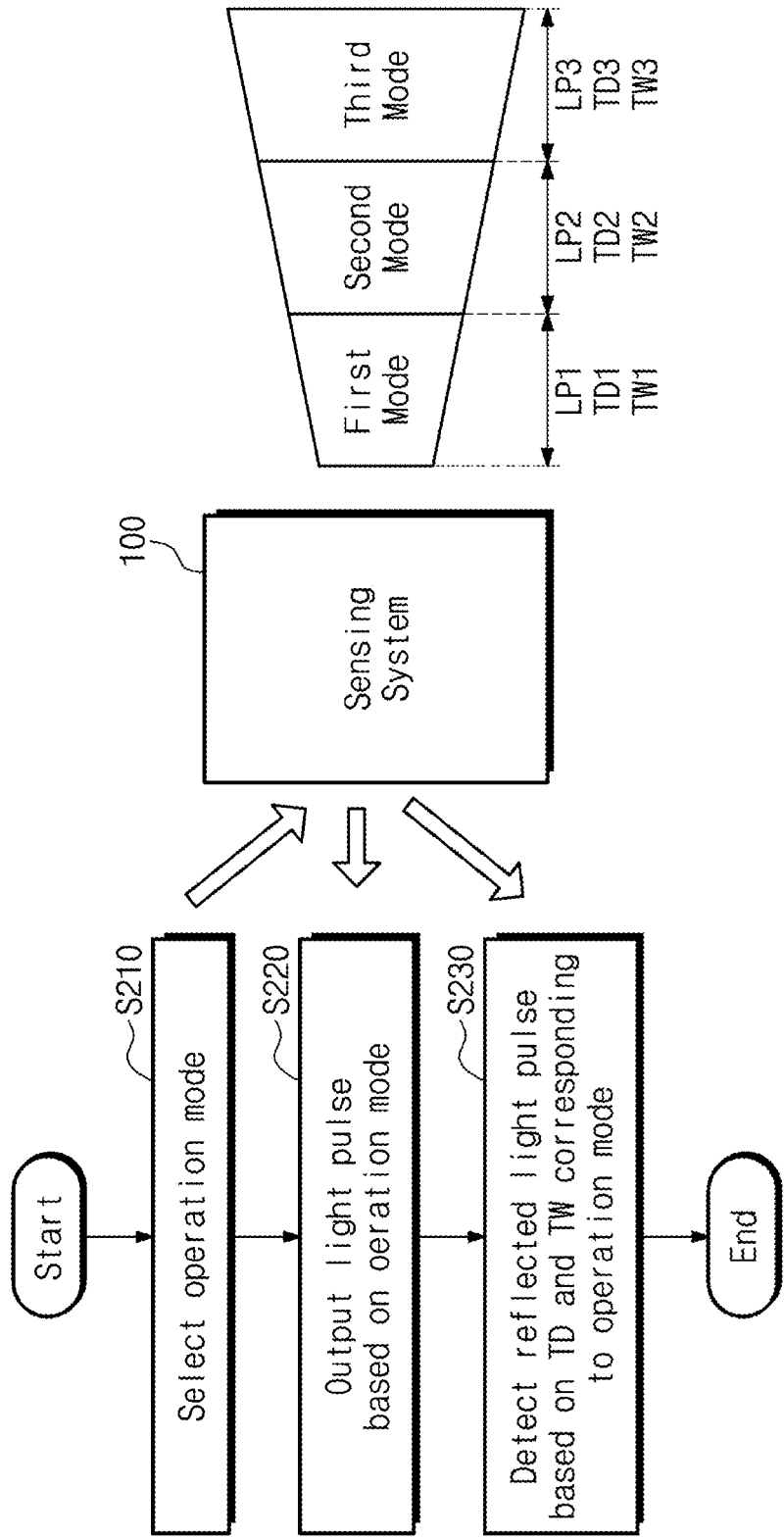

FIG. 10 is an example flowchart of an operation method of a sensing system of FIG. 1. An embodiment corresponding to the case where measuring ranges of a depth corresponding to operation modes are different and widths of the measuring ranges are different will be described with reference to operations of FIG. 10. For convenience of description, FIG. 10 will be described with reference to signs of FIGS. 1 and 2.

In operation S210, the processor 130 may select an operation mode of the sensing system 100. In an embodiment, the operation mode may include a first mode, a second mode, and a third mode. The first mode may be an operation mode for sensing an object within a first range. The second mode may be an operation mode for sensing an object within a second range that is more distant from the sensing system 100 than the first range. The third mode may be an operation mode for sensing an object within a third range that is more distant from the sensing system 100 than the second range. The widths of the first to third ranges may be different.

In operation S220, the light unit 110 may output light pulses to the outside. The light unit 110 may output light pulses having a pulse width corresponding to the selected operation mode to the outside. The light pulses may include first, second, and third light pulses LP1, LP2, and LP3 respectively corresponding to the first, second, and third modes. A pulse width of each of the first, second, and third light pulses LP1, LP2, and LP3 may be decided depending on a width of each of the first, second, and third ranges. For example, in the case where the width of the second range is greater than the width of the first range, the pulse width of the second light pulses LP2 may be greater than the pulse width of the first light pulses LP1.

In operation S230, the sensor 120 may detect or sense the reflected light pulses. The driving circuit 124 may generate an overflow control signal and photo gate signals so as to have the delay time TD and the window time TW corresponding to the selected operation mode. The delay time TD may include the first, second, and third delay times TD1, TD2, and TD3 respectively corresponding to the first, second, and third modes. A start time point of the window time TW may be decided based on the first to third delay times TD1 to TD3. The window time TW may include first, second, and third window times TW1, TW2, and TW3 respectively corresponding to the first, second, and third modes. For example, in the case where the width of the second range is greater than the width of the first range, a width of the second window time TW2 may be greater than a pulse width of the first window time TW1. Accordingly, the lower limit, the upper limit, and the width of the measuring range may be changed depending on a change of an operation mode.

In the case where one operation mode is selected, the sensing system 100 may repeatedly sense light pulses having a given period during the sensing time. While light pulses are repeatedly sensed, the sensing system 100 may sense light pulses based on the delay time TD and window time TW that are fixed. For example, in the case where a measuring range is between 3 m and 6 m from the sensing system 100, the sensing system 100 may repeatedly sense light pulses based on the delay time TD and the window time TW corresponding to the measuring range of 3 m to 6 m.

However, at least some example embodiments of the inventive concepts are not limited thereto. For example, the sensing system 100 may repeatedly sense light pulses while sequentially increasing or decreasing the delay time TD or the window time TW. For example, in the case where the measuring range is between 3 m and 6 m from the sensing system 100, the sensing system 100 may sense at least one light pulse based on the delay time TD and window time TW corresponding to the measuring range of 3 m to 4 m. Next, the sensing system 100 may sense at least one light pulse based on the delay time TD and window time TW corresponding to the measuring range of 3 m to 5 m. Then, the sensing system 100 may sense at least one light pulse based on the delay time TD and window time TW corresponding to the measuring range of 3 m to 6 m. Here, because the lower limit of the measuring range is fixed to 3 m, the delay time TD may not be changed. However, because the width of the measuring range sequentially increases, the window time TW may sequentially increase.

Figure 11:
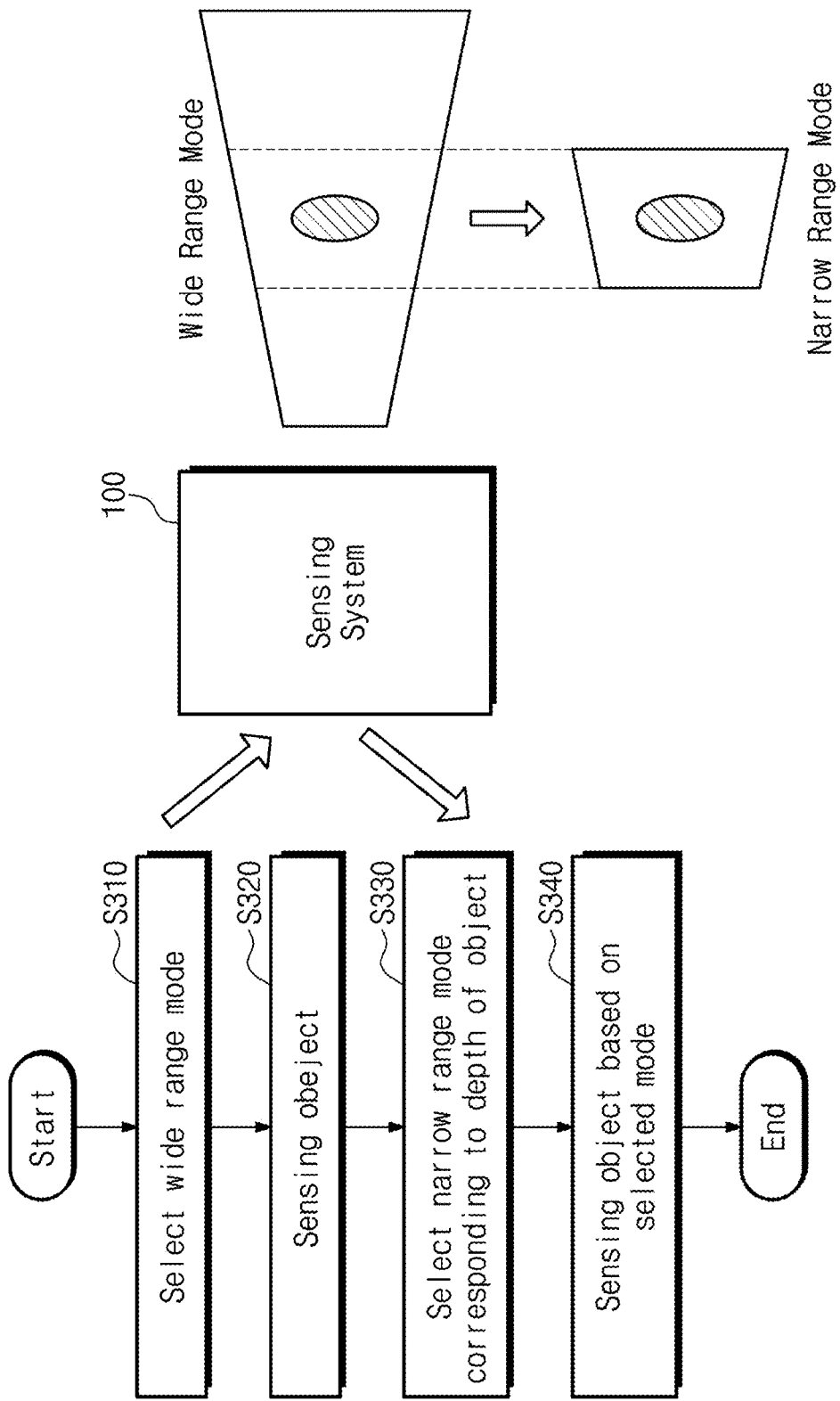

FIG. 11 is an example flowchart of an operation method of a sensing system of FIG. 1. An embodiment corresponding to the case of finely measuring a depth of an object after coarsely measuring the depth of the object will be described with reference to operations of FIG. 11. For convenience of description, FIG. 11 will be described with reference to signs of FIGS. 1 and 2.

In operation S310, the processor 130 may select a wide range mode (or a first mode). In operation S320, the sensing system 100 may sense an object depending on the first mode. As described with reference to FIG. 10, the light unit 110 may output light pulses having a pulse width corresponding to the first mode to the outside. The sensor 120 may generate an overflow control signal and photo gate signals so as to have a delay time and a window time corresponding to the first mode. The sensor 120 may sense reflected pulses received during the window time. The processor 130 may calculate a coarse depth of an object, based on the sensed result.

In operation S330, the processor 130 may adjust the measuring range of the object, based on the depth of the object calculated through the wide range mode. The processor 130 may decide the lower limit, the upper limit, and the width of the measuring range such that the object exists within the measuring range. A narrow range mode (or a second mode) is selected depending on the decided measuring range. In the second mode, the measuring range may have an upper limit lower than in the first mode, a lower limit higher than in the first mode, and a width narrower than in the first mode.

In operation S340, the sensing system 100 may sense the object depending on the selected second mode. As an operation mode changes from the first mode to the second mode, a pulse width of light pulses, a delay time, and a window time may be changed. For example, the pulse width of the light pulses may decrease, the delay time may increase, and the window time may decrease. As a result, dust or raindrops being out of the measuring range or another object of a long distance may not be sensed by the sensing system 100. Also, as the measuring range becomes narrower, the accuracy of the depth of the object may increase.

Figure 12:
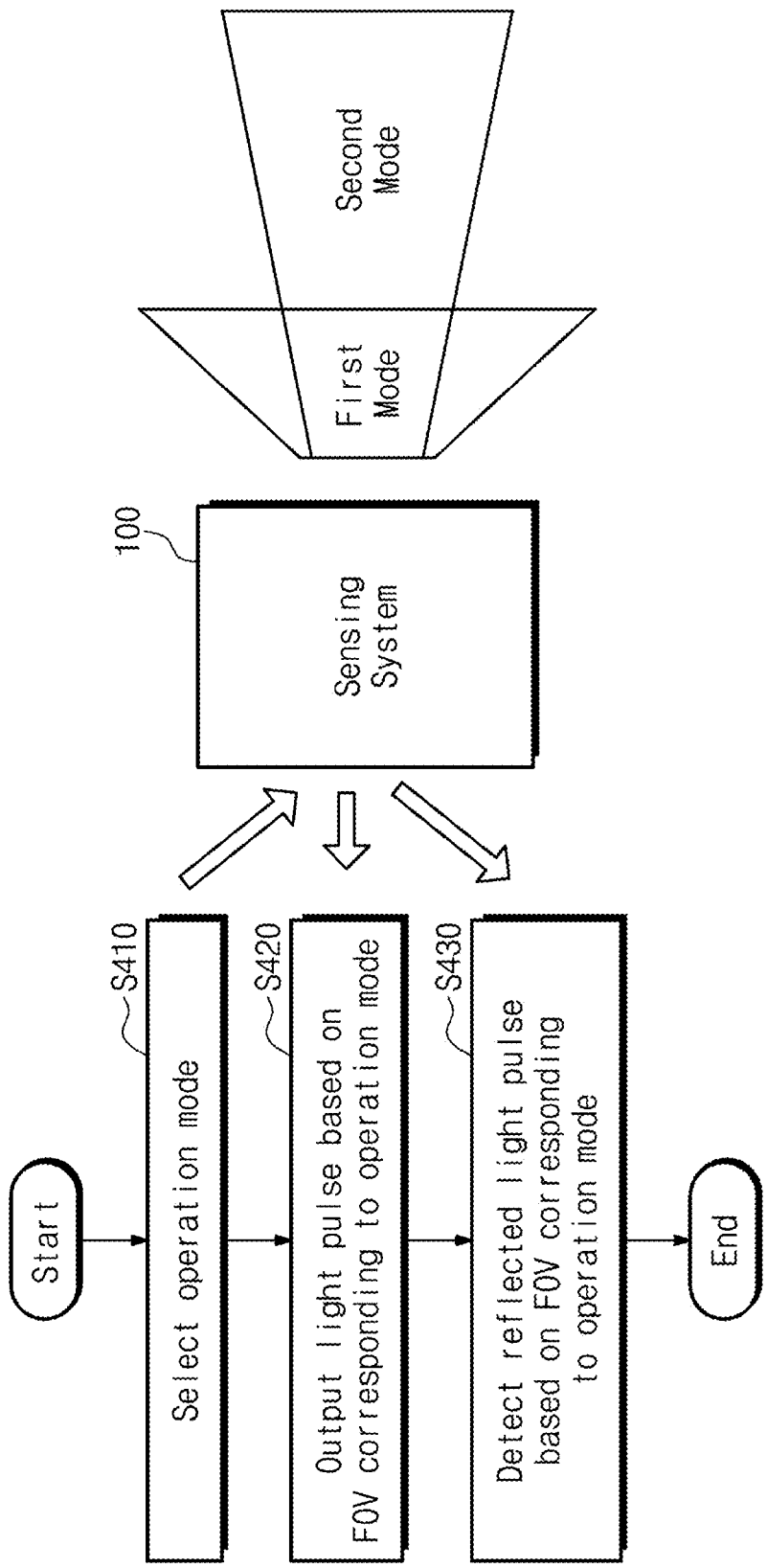

FIG. 12 is an example flowchart of an operation method of a sensing system of FIG. 1. An embodiment corresponding to the case of deciding a sensing range of an object in consideration of a field of view will be described with reference to operations of FIG. 12. For convenience of description, FIG. 12 will be described with reference to signs of FIGS. 1 and 2.

In operation S410, the processor 130 may select an operation mode of the sensing system 100. In an embodiment, the operation mode may include a first mode and a second mode. The first mode may be an operation mode for sensing an object within a first range. The second mode may be an operation mode for sensing an object within a second range that is more distant from the sensing system 100 than the first range.

In operation S420, the light unit 110 may output light pulses to the outside with an angle range corresponding to the selected operation mode. The angle range in the first mode may be greater than an angle range in the second mode. That is, the sensing system 100 may sense an object within a wider field of view when sensing an object of a close distance than when sensing an object of a long distance. For example, in the case where the sensing system 100 is implemented at a vehicle system, the vehicle system may easily cope with an unexpected action of a pedestrian by making a sensing angle in the first mode wide.

In operation S430, the sensor 120 may sense pulses reflected with an angle range corresponding to the selected operation mode. The angle range in the first mode may be greater than an angle range in the second mode. Also, as described above, the driving circuit 124 may generate an overflow control signal and photo gate signals so as to have a delay time and a window time corresponding to the selected operation mode.

Figure 13:
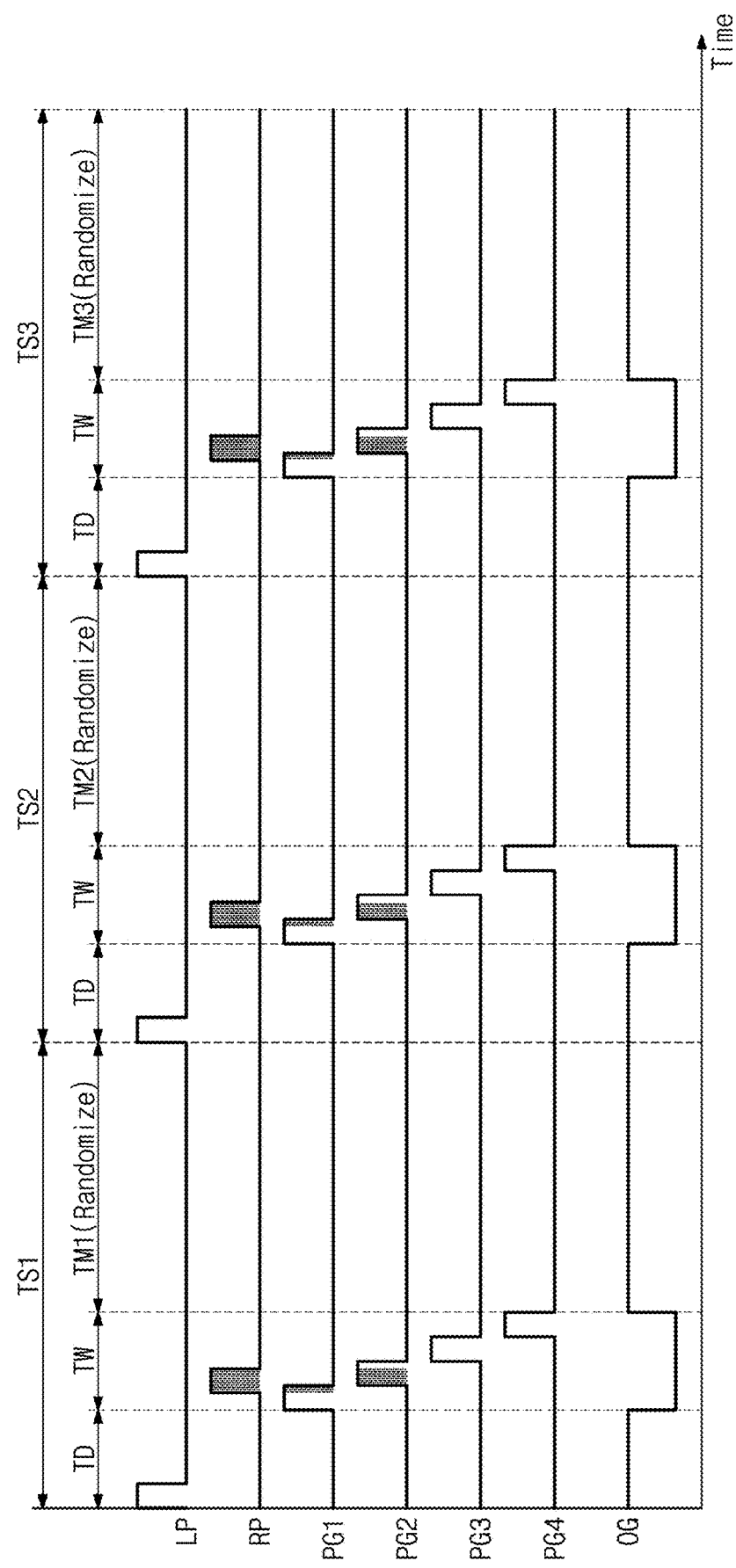
FIGS. 13 and 14 are example timing diagrams of a sensing time of FIG. 5 or 6.

FIG. 13 is an example timing diagram of a sensing time of FIG. 6. A difference between the timing diagram of FIG. 13 and the timing diagram of FIG. 7 is described.

Unlike FIG. 7, the reference times TS1, TS2, and TS3 may not have a uniform time interval as illustrated in FIG. 13. For example, in the case where the sensing system 100 is implemented at a vehicle system, a lot of sensing systems 100 may exist at a particular place. In this case, the light pulse signals LP output from the sensing system 100 may be reflected to another sensing system 100. In the case where the sensing system 100 measures a depth of an object based on the same reference time, the sensing system 100 may periodically sense the reflection pulse signal RP of a light output from another sensing system 100 and may calculate a wrong depth. To prevent this interference between the sensing systems 100, the sensing system 100 may randomly adjust time intervals of the reference times TS1 to TS3 depending on a given pattern or a signal generated by any random number generator. Even through reference times are randomly adjusted, because the light pulse signals LP generated from the light source 112 are synchronized with the sensor 120, the light pulse signals LP may have no influence on distance measurement. In contrast, light pulse signals generated from a light source of another system are incident onto the sensor 120 randomly in time, the light pulse signals are sensed as a phase-free noise.

Even though a pattern is not completely random, the sensing system 100 may reduce the interference by another system by using the light pulse signals LP having a long repetition period. For example, in the case where an operation mode is not changed, the delay time TD and the window time TW may be uniformly maintained in each of the reference times TS1 to TS3. The reference times TS1 to TS3 may include different masking times TM1, TM2, and TM3, respectively. A pattern of the masking times TM1, TM2, and TM3 may be set in advance by the processor 130 or the driving circuit 124. An output light component of another sensing system to be included in the sensed reflection pulse signal RP may decrease based on the preset pattern of the masking times TM1, TM2, and TM3.

Figure 14:
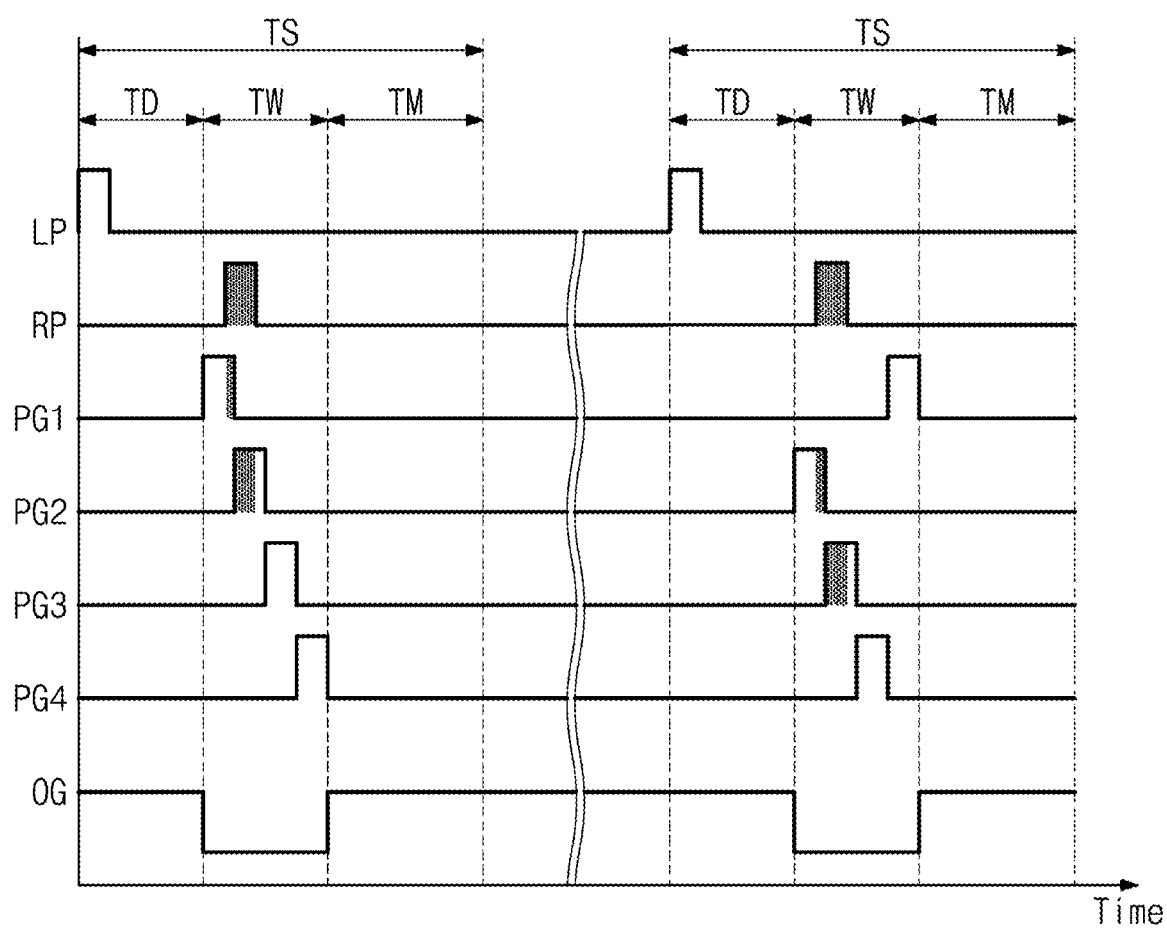

FIG. 14 is an example timing diagram of a sensing time of FIG. 5 or 6. A difference between the timing diagram of FIG. 14 and the timing diagram of FIG. 7 is described.

Referring to FIG. 14, the first, second, third, and fourth photo gate signals PG1, PG2, PG3, and PG4 may have different phases. For example, during the first sensing time, the first, second, third, and fourth photo gate signals PG1, PG2, PG3, and PG4 may have phases of 0°, 90°, 180°, and 270°. During the second sensing time, the first, second, third, and fourth photo gate signals PG1, PG2, PG3, and PG4 may have phases of 270°, 0°, 90°, and 180°. That is, the order in which the first to fourth readout circuits RO1 to RO4 receive and store charges may be shuffled. This order may be shuffled in units of a frame or in units of an operation of measuring a depth, but at least some example embodiments of the inventive concepts are not limited thereto.

Although not illustrated in FIG. 14, during the third sensing time, the first, second, third, and fourth photo gate signals PG1, PG2, PG3, and PG4 may have phases of 180°, 270°, 0°, and 90° or phases of 90°, 180°, 270°, and 0°. A part of the above four orders in which the first to fourth readout circuits RO1 to RO4 receive and store charges will be omitted. A fixed pattern noise (FPN) occurring at the pixel array 121 may decrease through this shuffling.

Figure 15:
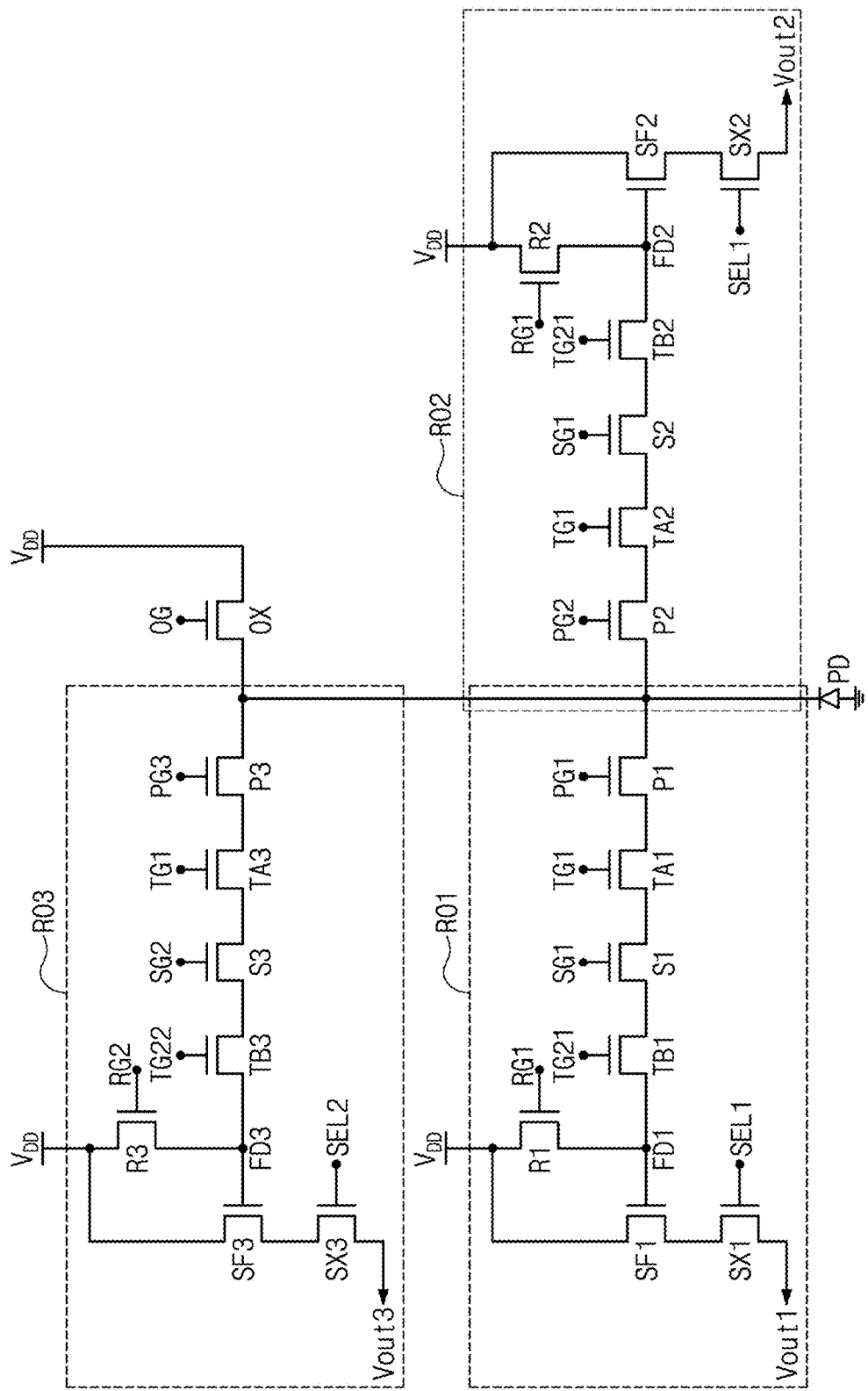
FIGS. 15 and 16 are example circuit diagrams of a pixel of FIG. 1.

FIG. 15 is an example circuit diagram of a pixel of FIG. 1. Referring to FIG. 15, a pixel PXb may include the photoelectric conversion element PD, the first readout circuit RO1, the second readout circuit RO2, the third readout circuit RO3, and the overflow transistor OX. Compared to FIG. 2, the pixel PXb of FIG. 15 may include the three readout circuits RO1 to RO3. In this case, the overflow transistor OX may be disposed at a location of the fourth readout circuit RO4 of FIG. 2.

Figure 16:
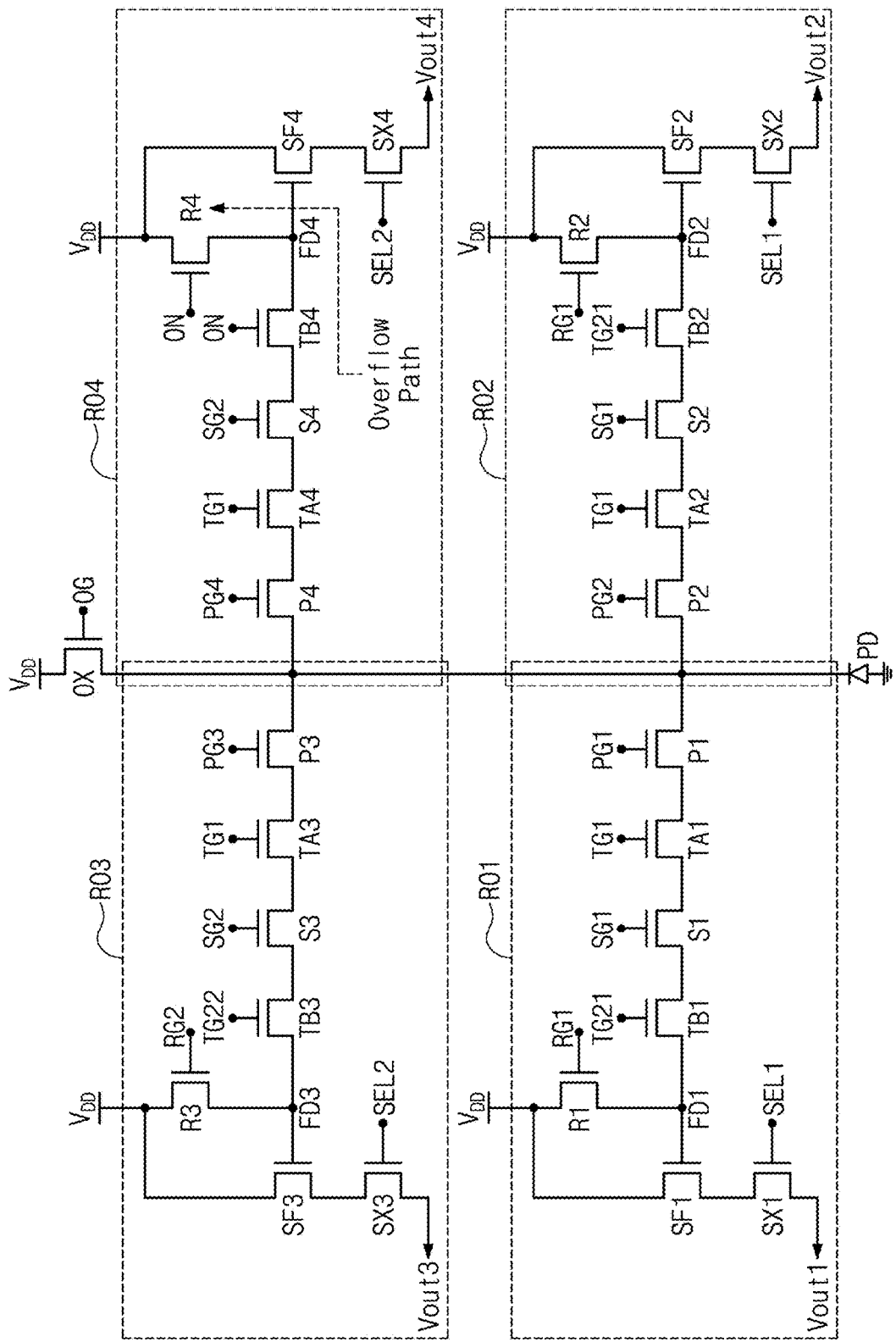

FIG. 16 is an example circuit diagram of a pixel of FIG. 1. Referring to FIG. 16, a pixel PXc may include the photoelectric conversion element PD, the first readout circuit RO1, the second readout circuit RO2, the third readout circuit RO3, the fourth readout circuit RO4, and the overflow transistor OX. A circuit structure of the pixel PXc of FIG. 16 is substantially identical to the circuit structure of the pixel PXa of FIG. 2, and thus, additional description will be omitted to avoid redundancy.

Unlike the fourth readout circuit RO4 of FIG. 2, the fourth readout circuit RO4 of FIG. 16 forms an overflow path during a delay time and a masking time of the sensing time. The fourth photo transistor P4 may be turned on during the above delay time and masking time, and the fourth photo transistor P4 is turned off during a window time. During the sensing time, the first transfer transistor TA4, the storage transistor S4, the second transfer transistor TB4, and the reset transistor R4 of the fourth readout circuit RO4 are turned on. As a result, charges generated during the delay time and the masking time may be removed by the fourth readout circuit RO4.

Unlike the overflow transistor OX of FIG. 2, the overflow transistor OX may be turned off during the sensing time. That is, charges generated during the sensing time based on an object being out of a measuring range of a depth are removed by the fourth readout circuit RO4 instead of the overflow transistor OX. The overflow transistor OX may be turned on during a time other than the sensing time, for example, the global reset time and the readout time, and thus, charges generated from an external light may be removed.

Figure 17:
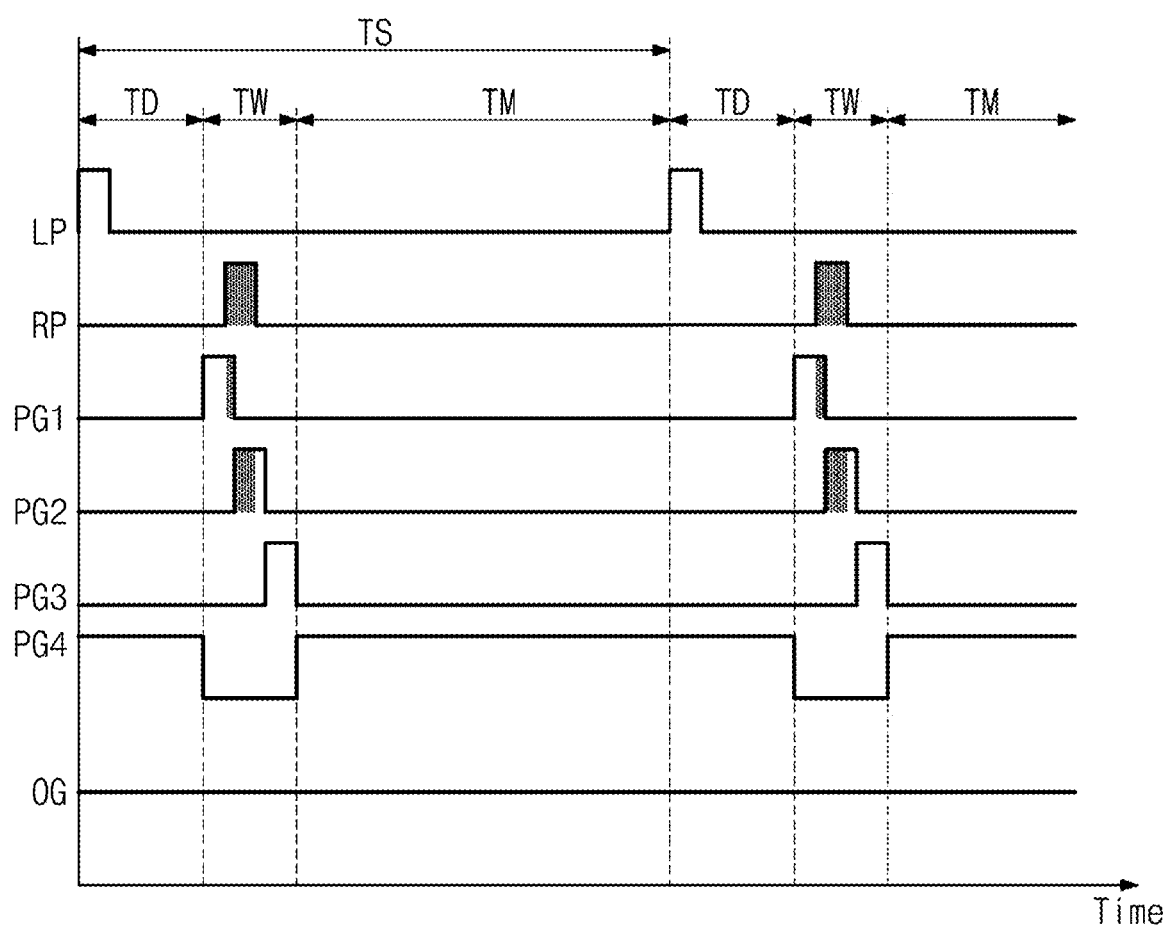
FIGS. 17 and 18 are example timing diagrams of a sensing time of a pixel of FIG. 16.

FIG. 17 is an example timing diagram of a sensing time of a pixel of FIG. 16. In FIG. 17, a horizontal axis represents a time, and a vertical axis represents magnitudes of the first to fourth photo gate signals PG1 to PG4 and the overflow control signal OG. A difference between the timing diagram of FIG. 17 and the timing diagram of FIG. 7 is described.

During the window time TW, the first, second, and third photo gate signals PG1, PG2, and PG3 may have different phases and may have the high level at different times. The fourth photo gate signal PG4 may have the high level during the delay time TD and the masking time TM and may have the low level during the window time TW. That is, the fourth photo gate signal PG4 may have the same waveform as the overflow control signal OG of FIG. 5 during the sensing time. In response to the fourth photo gate signal PG4, the pixel PXc may not sense an object being out of a measuring range selected by the processor 130.

During the sensing time, the overflow control signal OG may have the low level. The overflow control signal OG may have the high level during a time other than the sensing time, for example, the global reset time and the readout time. In response to the overflow control signal OG, the pixel PXc may remove charges generated from the photoelectric conversion element PD during a time other than the sensing time.

Figure 18:
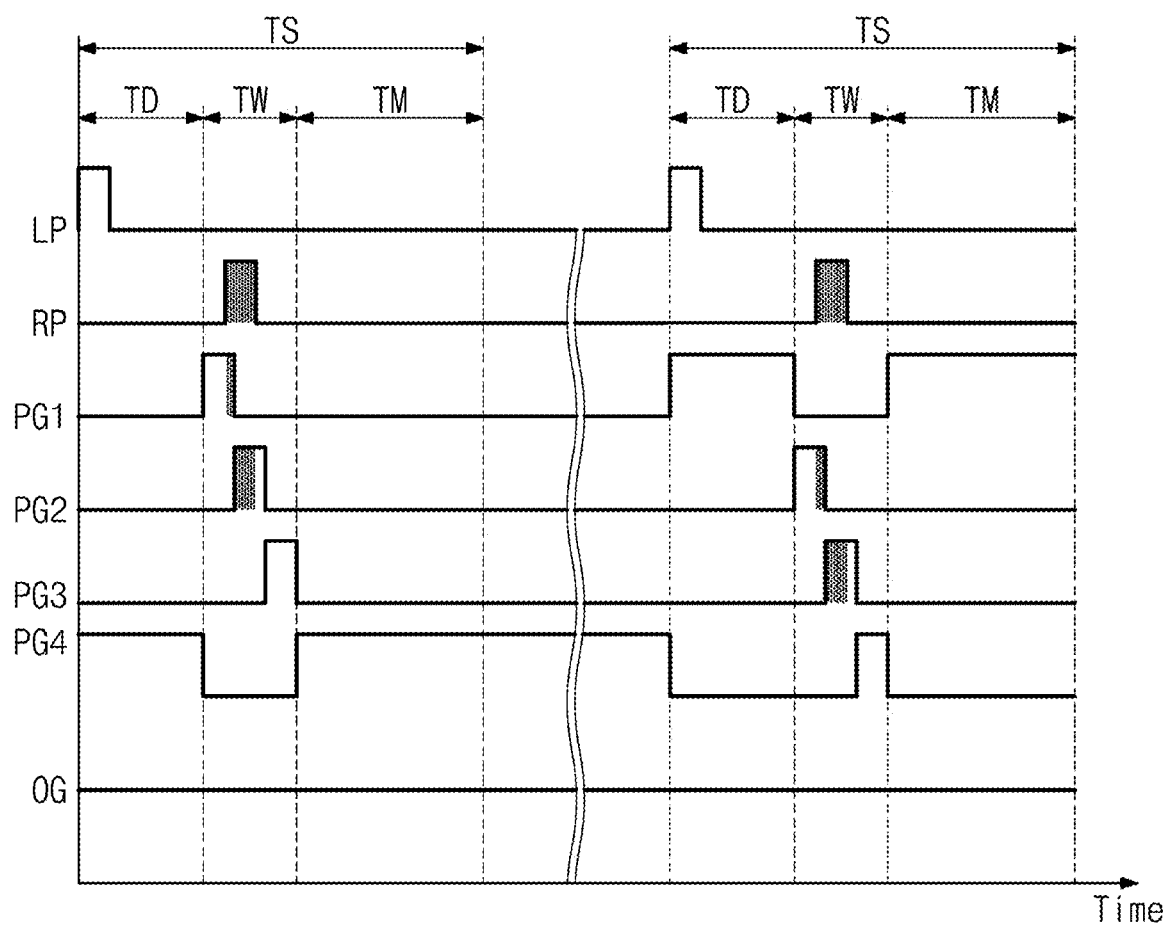

FIG. 18 is an example timing diagram of a sensing time of a pixel of FIG. 16. A difference between the timing diagram of FIG. 18 and the timing diagram of FIG. 17 is described.

Referring to FIG. 18, during the first sensing time, the first, second, and third photo gate signals PG1, PG2, and PG3 may have phases of 0°, 120°, and 240°. The fourth photo gate signal PG4 may have the high level so as to form an overflow path during the delay time TD and the masking time TM. During the second sensing time, the second, third, and fourth photo gate signals PG2, PG3, and PG4 may have phases of 0°, 120°, and 240°. The first photo gate signal PG1 may have the high level so as to form an overflow path during the delay time TD and the masking time TM. That is, the order in which the first to fourth readout circuits RO1 to RO4 receive and store charges may be shuffled. This order may be shuffled in units of a frame or in units of an operation of measuring a depth, but at least some example embodiments of the inventive concepts are not limited thereto. A fixed pattern noise (FPN) occurring at the pixel array 121 may decrease through this shuffling.

Figure 19:
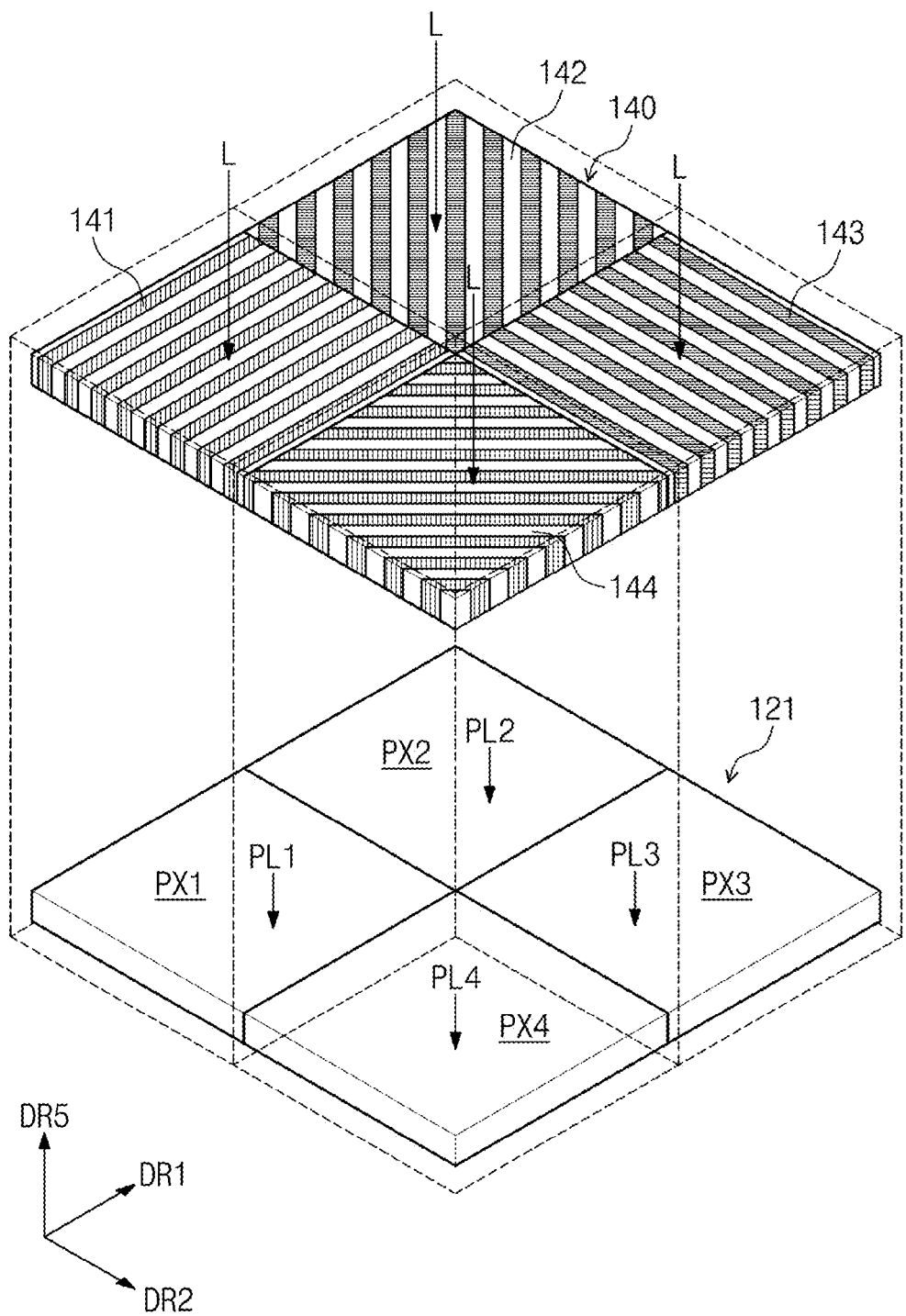
FIG. 19 is an example cross-sectional view of a pixel array of FIG. 1.

FIG. 19 is an example cross-sectional view of a pixel array of FIG. 1. Referring to FIG. 19, the pixel array 121 includes the first, second, third, and fourth pixels PX1, PX2, PX3, and PX4 two-dimensionally arranged in the first direction DR1 and the second direction DR2. A polarizer array 140 may be disposed on the pixel array 121 so as to be stacked in a fifth direction DR5.

The polarizer array 140 may include first, second, third, and fourth polarization gratings 141, 142, 143, and 144 respectively disposed on the first, second, third, and fourth pixels PX1, PX2, PX3, and PX4. The first to fourth polarization gratings 141 to 144 may have different polarization directions. For example, the first polarization grating 141 may be arranged in parallel with the first direction DR1. The second polarization grating 142 may be arranged in a direction that forms 45 degrees with the first direction DR1. The third polarization grating 143 may be arranged in parallel with the first direction DR1. The fourth polarization grating 144 may be arranged in a direction that forms 135 degrees with the first direction DR1. A light "L" (e.g., reflected pulses) incident onto the pixel array 121 may be polarized by the first to fourth polarization gratings 141 to 144, and polarized lights PL1 to PL4 may be incident onto the pixel array 121. For example, the pixel array 121 may include both a pixel to which a polarization grating is applied and a pixel to which a polarization grating is not applied.

The lights PL1 to PL4 passing through the polarizer array 140 may have different intensities. As such, the first to fourth pixels PX1 to PX4 may sense the lights PL1 to PL4 of first to fourth polarization components, and a ToF value according to the sensing result may be calculated. The intensity of a light according to a polarization component may be associated with a slope of an object when an output light is reflected. The sensing system 100 may exactly calculate a three-dimensional depth image of an object by detecting intensities of lights associated with different polarization components.

For example, the first to fourth polarization gratings 141 to 144 may be formed in a convex-concave structure in which a conductive pattern including a metal material and a dielectric pattern including an insulating material are stacked in order. For example, the first to fourth polarization gratings 141 to 144 may be formed in a convex-concave structure in which a first dielectric pattern and a second dielectric pattern having different refractive indexes are stacked to form a cross section of a wedge shape. For example, the first to fourth polarization gratings 141 to 144 may be formed in a structure an anti-reflection layer is disposed on a semiconductor substrate that is etched to have a cross section of a wedge shape.

Figure 20:
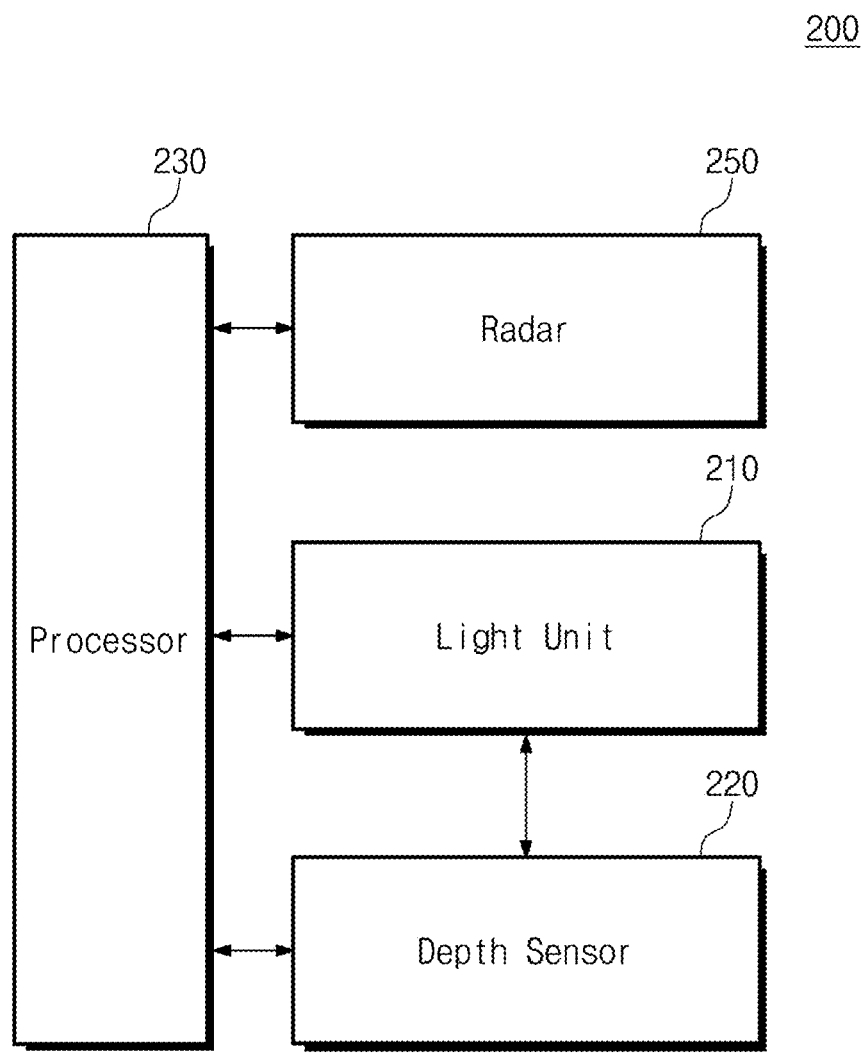
FIG. 20 is a block diagram of a sensing system according to at least one example embodiment of the inventive concepts.

FIG. 20 is a block diagram of a sensing system according to at least one example embodiment of the inventive concepts. Referring to FIG. 20, a sensing system 200 includes a light unit 210, a depth sensor 220, a processor 230, and a radar 250. The light unit 210, the depth sensor 220, and the processor 230 correspond to the light unit 110, the sensor 120, and the processor 130, respectively, and thus, additional description will be omitted to avoid redundancy.

The radar 250 may output an electromagnetic wave and may sense a reflected wave of the electromagnetic wave. The radar 250 may output an electromagnetic wave of a microwave range. Through the radar 250, the sensing system 200 may recognize a coarse distance of an object. The processor 230 may decide a measuring range of a depth based on the coarse distance of the recognized object. The depth sensor 220 may generate an overflow control signal and photo gate signals for the purpose of sensing an object within the decided measuring range. This procedure is identical to the procedure described above.

Figure 21:
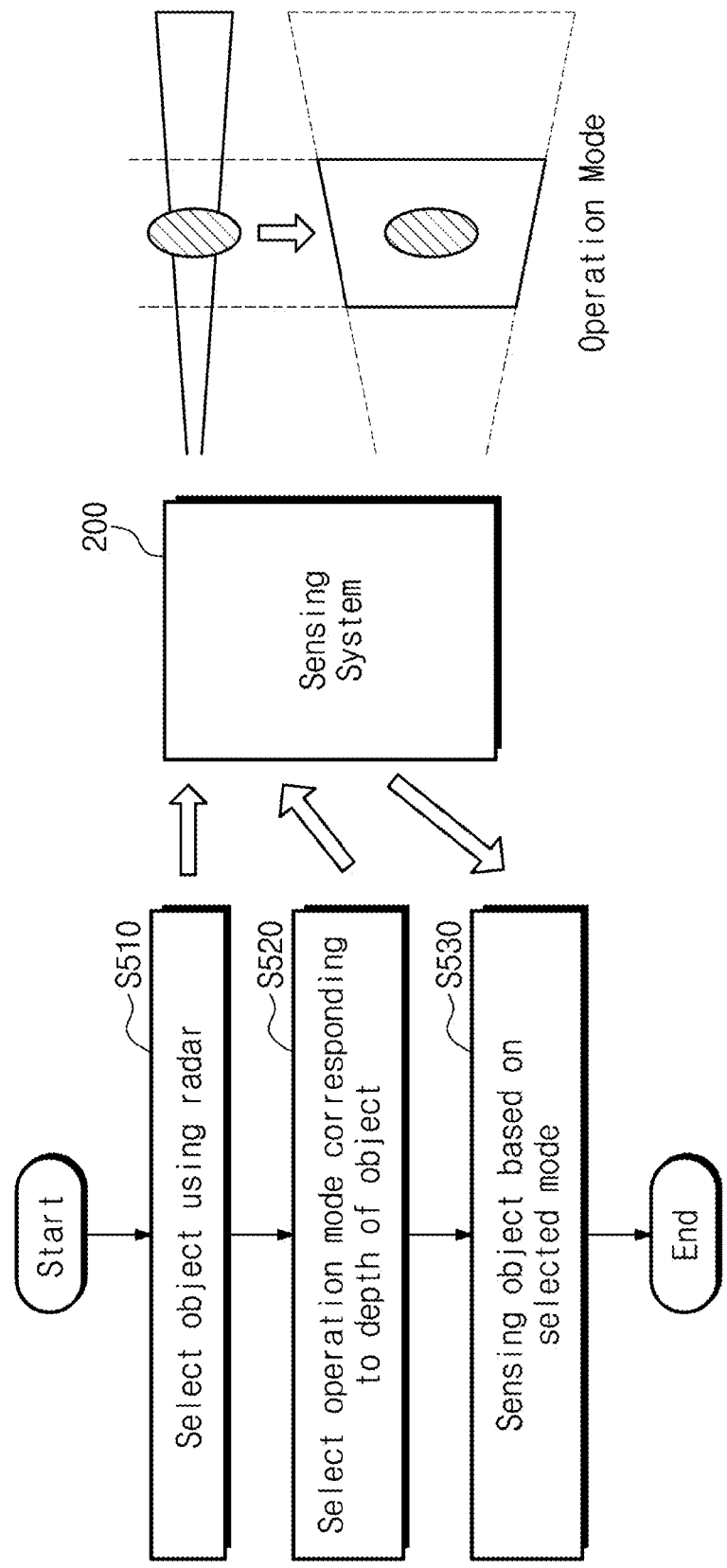
FIG. 21 is an example flowchart of an operation method of a sensing system of FIG. 20.

FIG. 21 is an example flowchart of an operation method of a sensing system of FIG. 20. An embodiment corresponding to the case of finely measuring a depth of an object after coarsely measuring the depth of the object will be described with reference to operations of FIG. 21. For convenience of description, FIG. 21 will be described with reference to signs of FIG. 20.

In operation S510, the sensing system 200 may sense a coarse distance of an object by using the radar 250. The radar 250 may output an electromagnetic wave and may sense an electromagnetic wave reflected by the object. The sensing system 200 may calculate the coarse distance of the object based on the sensed reflected wave.

In operation S520, the processor 230 may adjust a measuring range of the object, based on the depth of the object calculated through the radar 250. The processor 230 may decide the lower limit, the upper limit, and the width of the measuring range such that the object exists within the measuring range.

In operation S530, the sensing system 200 may sense the object depending on the selected mode, that is, depending on the selected measuring range. Depending on the selected measuring range, the depth sensor 220 may generate an overflow control signal and photo gate signals so as to have a delay time and a window time described above.

Figure 22:
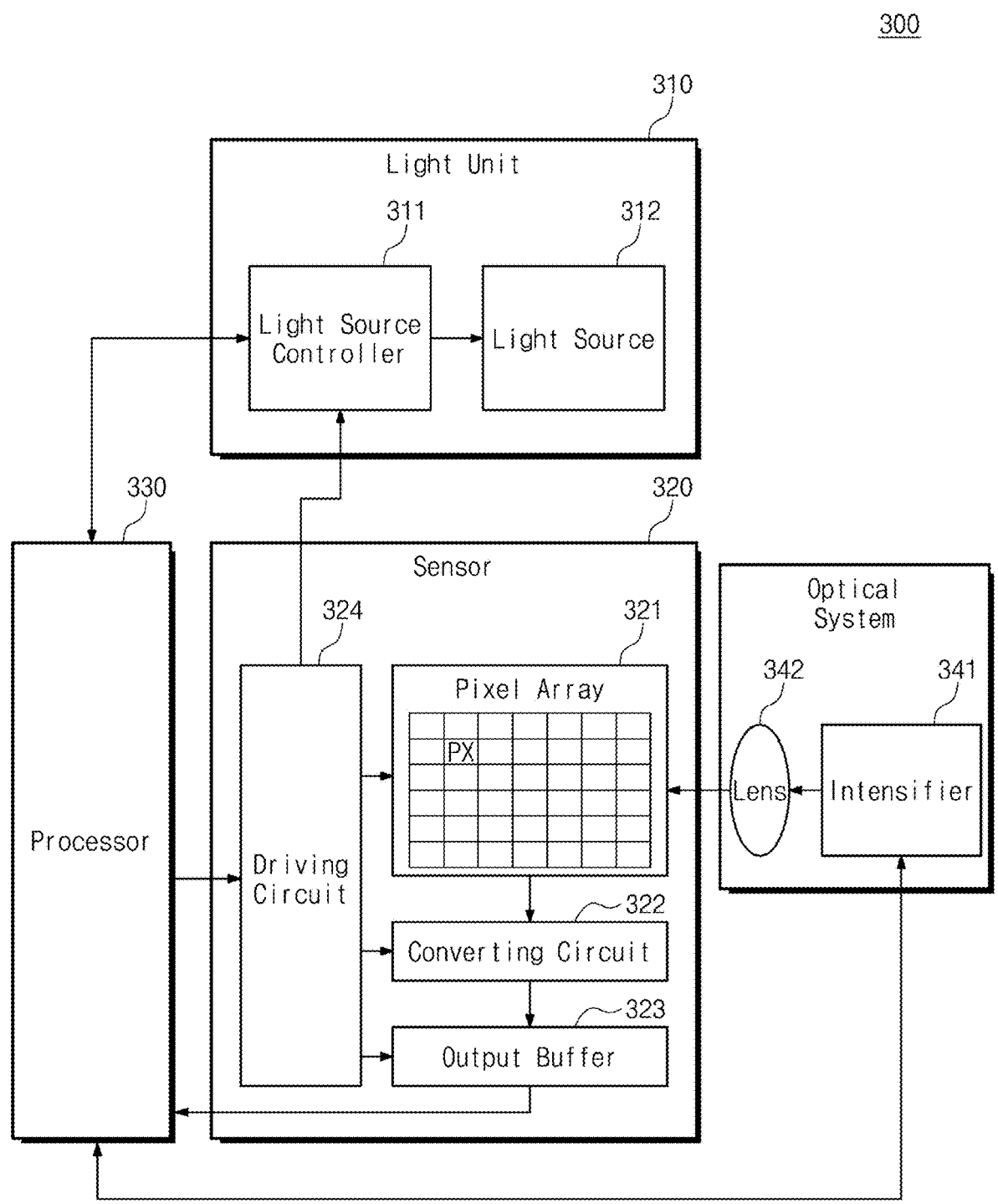
FIG. 22 is a block diagram of a sensing system according to at least one example embodiment of the inventive concepts.

FIG. 22 is a block diagram of a sensing system according to at least one example embodiment of the inventive concepts. Referring to FIG. 22, a sensing system 300 includes a light unit 310, a sensor 320, a processor 330, and an optical system 340. The light unit 310, the depth sensor 320, and the processor 330 correspond to the light unit 110, the sensor 120, and the processor 130 of FIG. 1, respectively, and thus, additional description will be omitted to avoid redundancy.

The optical system 340 may include an intensifier 341 and a lens unit 342. The intensifier 341 may amplify a reflected light received in response to a light output from the light unit 310. In the case of measuring a depth of an object of a long distance, the intensity of reflected pulses decreases. The amount of photons input to the sensor 320 is inversely proportional to a square of a distance of an object. The intensifier 341 may be configured to amplify the intensity of reflected pulses such that the sensor 320 senses the amplified reflected pulses. The intensifier 341 may be activated during the sensing time under control of the processor 330.

For example, the intensifier 341 may convert photos into charges by using a photoelectric effect. The intensifier 341 may cause a multiple photoelectric effect by applying and accelerating an electric field to the converted charges. Afterwards, the intensifier 341 may amplify a reflected pulse light by converting the generated charges into photons. The amplified reflected pulse light may arrive at a pixel array 321 of the sensor 320 through the lens unit 342.

Figure 23:
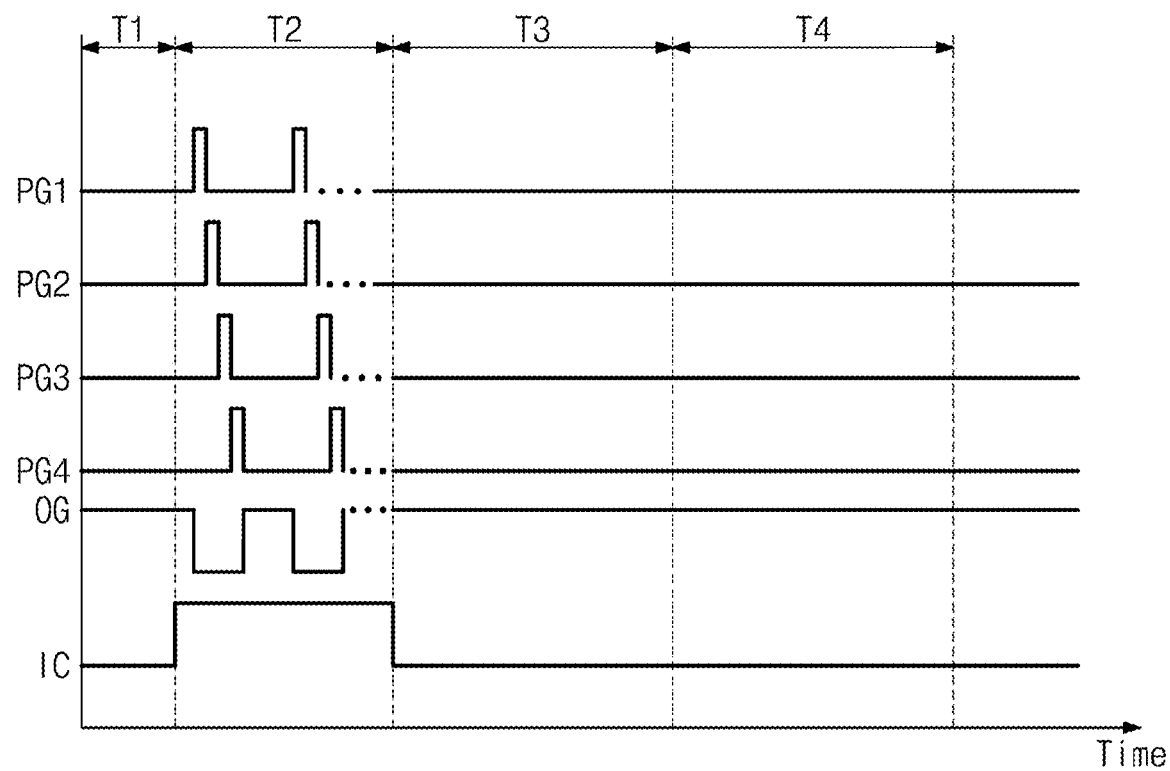
FIG. 23 is an example timing diagram of a pixel of FIG. 22.

FIG. 23 is an example timing diagram of a pixel of FIG. 22. In FIG. 23, a horizontal axis represents a time, and a vertical axis represents magnitudes of the first to fourth photo gate signals PG1 to PG4, the overflow control signal OG, and an intensifier control signal IC. Waveforms of the first to fourth photo gate signals PG1 to PG4 and the overflow control signal OG are identical to the waveforms of FIG. 5, and thus, additional description will be omitted to avoid redundancy.

The intensifier control signal IC may be understood as a signal for deciding the activation or deactivation of the intensifier 341 of FIG. 22. The intensifier control signal IC may have the high level during the second time T2, that is, the sensing time. The intensifier control signal IC may activate the intensifier 341 during the sensing time, thus improving the accuracy of depth measurement of an object. Also, the intensifier control signal IC may deactivate the intensifier 341 during a time other than the sensing time, thus reducing power consumption of the sensing system 300 by the intensifier 341. However, at least some example embodiments of the inventive concepts are not limited thereto. For example, the intensifier control signal IC may have the high level during the first to fourth times T1 to T4.

Figure 24:
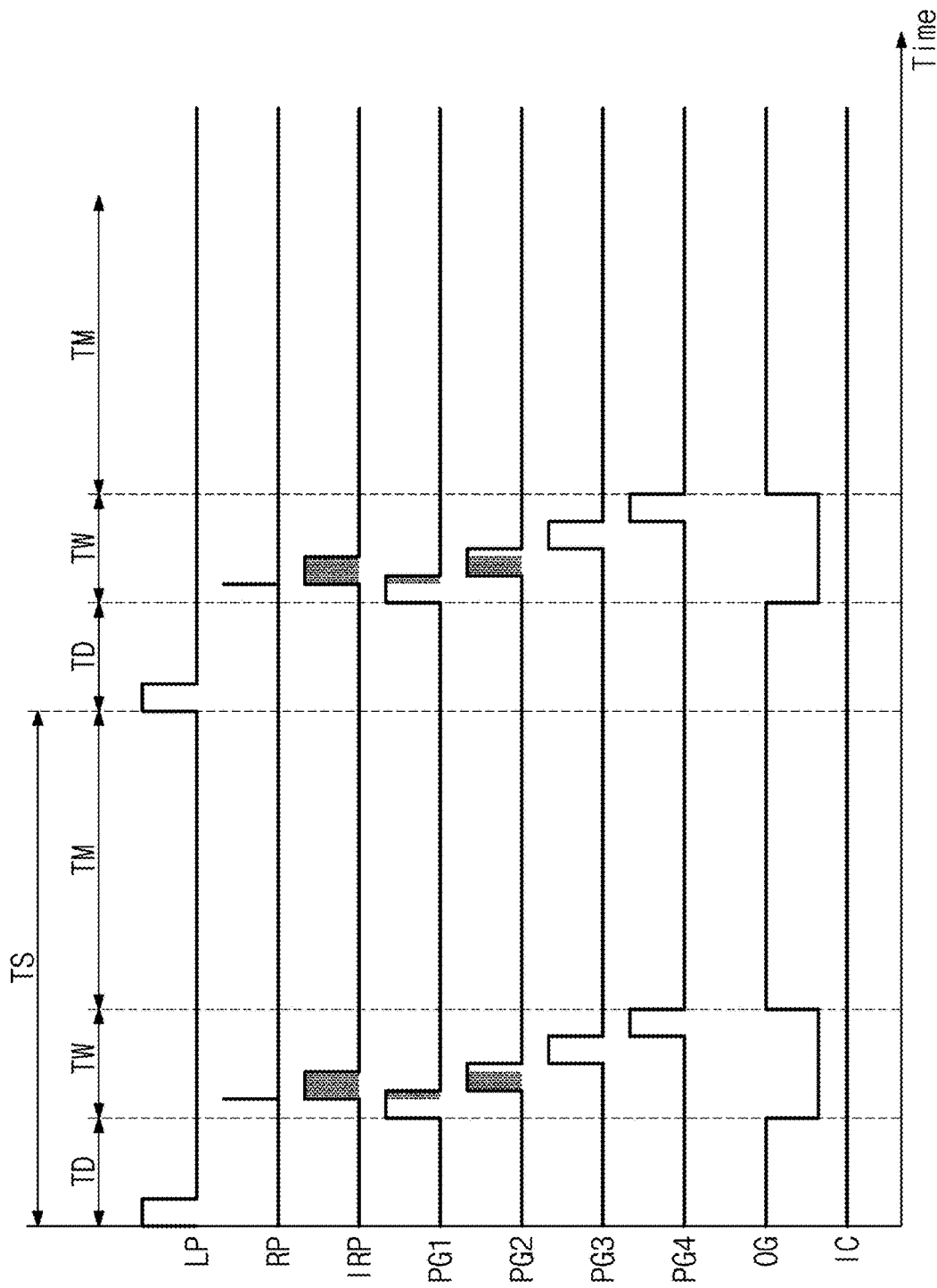
FIG. 24 is an example timing diagram of a sensing time of FIG. 23.

FIG. 24 is an example timing diagram of a sensing time of FIG. 23. In FIG. 24, a horizontal axis represents a time, and a vertical axis represents magnitudes of the light pulse signal LP, the reflection pulse signal RP, an amplified reflection pulse signal IRP, the first to fourth photo gate signals PG1 to PG4, the overflow control signal OG, and the intensifier control signal IC.

A pulse width of the reflection pulse signal RP reflected from an object of a long distance may be small enough to fail to sense by using the first to fourth photo gate signals PG1 to PG4 or to fail to calculate a signal ratio between readout circuits. As such, the intensifier control signal IC may activate the intensifier 341 during the sensing time to amplify the reflection pulse signal RP. As a result, the amplified reflection pulse signal IRP is generated. A pulse width of the amplified reflection pulse signal IRP may be greater than a pulse width of the reflection pulse signal RP. Accordingly, the sensor 320 may sense a light, and a signal ratio between readout circuits may be calculated.

According to at least one example embodiment of the inventive concepts, a sensor operating based on a measuring range of a depth and a sensing system including the sensor may measure a depth of an object existing within a particular range. Also, according to at least one example embodiment of the inventive concepts, the accuracy of measurement of a depth of an object may be improved.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:
1. A sensor comprising:
a pixel array including a pixel configured to generate a first pixel signal and a second pixel signal, based on a light sensed during a window time of a sensing time;
processing circuitry configured to select a measuring range from among a plurality of measuring ranges and set a width of the window time based on the selected measuring range;
a converting circuit configured to convert the first and second pixel signals into digital signals; and
a driving circuit configured to generate an overflow control signal, a first photo gate signal, and a second photo gate signal so as to sense the light during the window time,
wherein the pixel includes,
a photoelectric conversion element configured to generate charges based on the sensed light,
a first readout circuit configured to receive first charges generated during a first time of the window time based on the first photo gate signal and to generate the first pixel signal based on the first charges,
a second readout circuit configured to receive second charges generated during a second time of the window time based on the second photo gate signal and to generate the second pixel signal based on the second charges, and
an overflow transistor configured to remove third charges generated during a delay time of the sensing time from the photoelectric conversion element, based on the overflow control signal, and
wherein the delay time is before the window time in the sensing time,
wherein the overflow transistor is configured to remove the third charges in response to a level of the overflow control signal changing from a first level to a second, different level, and
wherein the width of the window of time corresponds to the width of the period of time during which the overflow control signal is set to the second level.

2. The sensor of claim 1, wherein the processing circuitry is configured such that, in response to a lower limit of the measuring range changing, the processing circuitry controls the driving circuit to adjust the overflow control signal such that the delay time is changed, and
wherein the overflow transistor is configured to turn on during the changed delay time based on the adjusted overflow control signal.

3. The sensor of claim 1, wherein the processing circuitry is configured such that, in response to a width of the measuring range changing, the processing circuitry controls the driving circuit to adjust the first and second photo gate signals such that widths of the first and second times are changed,
wherein the first readout circuit is configured to receive fourth charges generated during the changed first time based on the adjusted first photo gate signal, and
wherein the second readout circuit is configured to receive fifth charges generated during the changed second time based on the adjusted second photo gate signal.

4. The sensor of claim 1,
wherein the overflow transistor is configured to remove fourth charges generated during a masking time of the sensing time from the photoelectric conversion element, and
wherein the masking time is after the window time in the sensing time.

5. The sensor of claim 4,
wherein the processing circuitry is configured such that, in response to an upper limit of the measuring range changing, the processing circuitry is configured to control the driving circuit to adjust the overflow control signal such that the masking time is changed, and
wherein the overflow transistor is configured to turn on during the changed masking time based on the adjusted overflow control signal.

6. The sensor of claim 4, wherein the processing circuitry is configured such that, in response to a width of the measuring range changing, the processing circuitry controls the driving circuit to adjust the overflow control signal such that the window time is changed, and
wherein the overflow transistor is configured to turn off during the changed window time based on the adjusted overflow control signal.

7. The sensor of claim 4,
wherein the delay time, the first time, the second time, and the masking time are repeated within the sensing time,
wherein, as the masking time is repeated within the sensing time, the driving circuit adjusts the overflow control signal such that the masking time is changed, and
wherein the overflow transistor is configured to be turned on during the changed masking time based on the adjusted overflow control signal.

8. The sensor of claim 1, wherein the driving circuit is configured to,
generate the first and second photo gate signals such that the second time starts after the first time starts in a first sensing operation, and
generate the first and second photo gate signals such that the first time starts after the second time starts in a second sensing operation.

9. The sensor of claim 1,
wherein the first readout circuit comprises:
a first storage transistor configured to store the first charges during the sensing time and to transfer the stored first charges to a first floating diffusion area during a readout time after the sensing time;
a first photo transistor configured to transfer the first charges to the first storage transistor during the first time based on the first photo gate signal;
a first source follower transistor configured to generate the first pixel signal based on the first charges transferred to the first floating diffusion area; and
a first selection transistor configured to output the first pixel signal to the converting circuit during the readout time, and
wherein the second readout circuit comprises:
a second storage transistor configured to store the second charges during the sensing time and to transfer the stored second charges to a second floating diffusion area during the readout time;
a second photo transistor configured to transfer the second charges to the second storage transistor during the second time based on the second photo gate signal;
a second source follower transistor configured to generate the second pixel signal based on the second charges transferred to the second floating diffusion area; and
a second selection transistor configured to output the second pixel signal to the converting circuit during the readout time.

10. The sensor of claim 9, wherein the driving circuit is configured to control the first and second storage transistors to be turned on during the sensing time and to be turned on before the first and second pixel signals are output to the converting circuit after the sensing time.

11. The sensor of claim 1,
wherein the first photo gate signal and the second photo gate signal are rectangular pulses repeated within the sensing time, and
wherein a duty cycle of each of the first photo gate signal and the second photo gate signal is less than 0.5.

12. The sensor of claim 1,
wherein the first readout circuit comprises a first photo transistor and a first transfer transistor,
wherein the second readout circuit comprises a second photo transistor and a second transfer transistor
wherein the first and the second transfer transistors are configured to receive a first transfer control signal from the driving circuit, be turned on during the sensing time based on the first transfer control signal, and be turned off during a time other than the sensing time, and
wherein the first photo gate signal and the second photo gate signal have different phases.

13. The sensor of claim 1,
wherein a masking time is after the window time in the sensing time and the delay time, the first time, the second time, and the masking time are repeated within the sensing time, and
wherein first charges and second charges are accumulated as the delay time, the first time, the second time, and the masking time are repeated.

14. A sensor comprising:
a pixel array including a pixel configured to generate an analog signal including a plurality of pixel signals based on a light sensed during a sensing time;
a converting circuit configured to convert the analog signal into a digital signal; and
a driving circuit configured to generate a first photo gate signal, a second photo gate signal, a third photo gate signal, and a fourth photo gate signal based on a measuring range of a depth, wherein the pixel includes:
- a photoelectric conversion element configured to generate charges based on the sensed light;
- a first readout circuit including a first floating diffusion area and a first reset transistor, the first readout circuit being configured to receive first charges generated during a first time of the sensing time based on the first photo gate signal and to generate a first pixel signal based on the first charges;
- a second readout circuit including a second floating diffusion area and a second reset transistor, the second readout circuit being configured to receive second charges generated during a second time of the sensing time based on the second photo gate signal and to generate a second pixel signal based on the second charges;
- a third readout circuit including a third floating diffusion area and a third reset transistor, the third readout circuit being configured to receive third charges generated during a third time of the sensing time based on the third photo gate signal and to generate a third pixel signal based on the third charges; and
- a fourth readout circuit including a fourth floating diffusion area and a fourth reset transistor, wherein the driving circuit is further configured to control the fourth readout circuit to remove fourth charges generated during a fourth time, which is before the first to third times, of the sensing time from the photoelectric conversion element, based on the fourth photo gate signal.

15. The sensor of claim 14, wherein the sensor further comprises:
processing circuitry configured such that, in response to the measuring range is changing, the processing circuitry controls the driving circuit to adjust the first to fourth photo gate signals such that the first to fourth times are changed.

16. The sensor of claim 14,
wherein the first readout circuit is configured to remove fifth charges generated during a fifth time after the sensing time from the photoelectric conversion element based on the first photo gate signal,
wherein the second readout circuit is configured to receive sixth charges generated during a sixth time after the fifth time based on the second photo gate signal and to generate a fourth pixel signal based on the sixth charges,
wherein the third readout circuit is configured to receive seventh charges generated during a seventh time after the fifth time based on the third photo gate signal and to generate a fifth pixel signal based on the seventh charges, and
wherein the fourth readout circuit is configured to receive eighth charges generated during an eighth time after the fifth time based on the fourth photo gate signal and to generate a sixth pixel signal based on the eighth charges.

17. A sensing system comprising:
a light source configured to output light pulses;
a sensor configured to sense reflected pulses of the light pulses during a sensing time and to generate a depth image; and
processing circuitry configured to control the light source and the sensor based on an operation mode which depends on a measuring range of a depth, wherein the sensor includes:
- a pixel array including a pixel configured to generate pixel signals based on the reflected pulses, and
- a converting circuit configured to generate the depth image based on the pixel signals, and wherein the pixel includes:
- a photoelectric conversion element configured to generate charges based on the reflected pulses,
- readout circuits configured to generate the pixel signals based on first charges generated during a window time of the sensing time, and
- an overflow transistor configured to remove second charges generated during a delay time of the sensing time and to remove third charges generated during a masking time of the sensing time from the photoelectric conversion element, and wherein the delay time is before the window time within the sensing time and the masking time is after the window time within the sensing time, wherein the operation mode includes a first mode corresponding to a first measuring range and a second mode corresponding to a second measuring range and a second mode corresponding to a second measuring range more distant from the sensor than the first measuring range, and wherein the processing circuitry is configured to control the light source to output the light pulses with a first angle range in the first mode and to output the light pulses with a second angle range smaller than the first angle range in the second mode.

18. The sensing system of claim 17,
wherein the delay time in the first mode has a first width, and the delay time in the second mode has a second width greater than the first width.

19. The sensing system of claim 18,
wherein, processing circuitry is configured to control the sensor to receive the reflected pulses within a third angle range in the first mode and to receive the reflected pulses within a fourth angle range smaller than the third angle range in the second mode.

20. The sensing system of claim 17, wherein the operation mode includes a first mode corresponding to a first measuring range and a second mode corresponding to a second measuring range wider than the first measuring range, and
wherein the window time in the first mode has a first width, and the window time in the second mode has a second width greater than the first width.

21. The sensing system of claim 20, wherein the processing circuitry is configured to control the light source to output the light pulses having a third width in the first mode and to output the light pulses such that the light pulses have a fourth width greater than the third width in the second mode.

22. The sensing system of claim 17, further comprising:
a radar configured to output electromagnetic waves and to sense reflected waves of the electromagnetic waves,
wherein the processing circuitry is configure to select the operation mode based on the sensed reflected waves,
wherein the readout circuit is configured to generate the pixel signals based on the first charges generated during the window time which depends on the selected operation mode, and
wherein the overflow transistor is configured to remove the second and third charges generated during the delay time and the masking time from the photoelectric conversion element, wherein the processing circuitry is configured to set the delay time and masking time based on the selected operation mode.

23. The sensing system of claim 17, further comprising:
an intensifier configured to amplify the reflected pulses during the sensing time,
wherein the pixel is configured to generate the pixel signals based on the amplified reflected pulses.

* * * * *